US010865109B2

(12) United States Patent
Liu et al.

(10) Patent No.: US 10,865,109 B2
(45) Date of Patent: Dec. 15, 2020

(54) METHOD FOR PREPARATION OF MAGIC-SIZED NANO-CRYSTALLINE SUBSTANCE

(71) Applicant: SICHUAN UNIVERSITY, Chengdu (CN)

(72) Inventors: Mingyang Liu, Sichuan (CN); Kui Yu, Sichuan (CN); Qiyu Yu, Sichuan (CN); Jing Zhang, Sichuan (CN); Tingting Zhu, Sichuan (CN); Min Fu, Sichuan (CN); Li Zhang, Sichuan (CN)

(73) Assignee: SICHUAN UNIVERSITY, Chengdu (CN)

( * ) Notice: Subject to any disclaimer, the term of this patent is extended or adjusted under 35 U.S.C. 154(b) by 351 days.

(21) Appl. No.: 15/740,730

(22) PCT Filed: Jul. 22, 2016

(86) PCT No.: PCT/CN2016/090940
§ 371 (c)(1),
(2) Date: Dec. 28, 2017

(87) PCT Pub. No.: WO2017/016438
PCT Pub. Date: Feb. 2, 2017

(65) Prior Publication Data
US 2018/0186639 A1  Jul. 5, 2018

(30) Foreign Application Priority Data
Jul. 25, 2015 (CN) .......................... 2015 1 0444706

(51) Int. Cl.
C01B 19/00 (2006.01)
C09K 11/88 (2006.01)
(Continued)

(52) U.S. Cl.
CPC .......... *C01B 19/002* (2013.01); *C09K 11/883* (2013.01); *H01L 21/0259* (2013.01);
(Continued)

(58) Field of Classification Search
CPC .. C09K 11/883; C01B 19/002; Y10S 977/774
See application file for complete search history.

(56) References Cited

U.S. PATENT DOCUMENTS

| 7,235,190 B1 | 6/2007 | Wilcoxon et al. |
| 2014/0170692 A1 | 6/2014 | Krauss et al. |
| 2015/0203752 A1 | 7/2015 | Yu et al. |

FOREIGN PATENT DOCUMENTS

| EP | 2679538 | * | 1/2014 |
| EP | 2679538 A1 | | 1/2014 |
| WO | 2009120688 A1 | | 10/2009 |

OTHER PUBLICATIONS

W. William Yu et al., "Formation of high-quality CdS and other II-VI semiconductor nanocrystals in non-coordinating solvents: tunable reactivity of monomers", Angew. Chem. Int. Ed., 2002, 41, 2368-2371.
(Continued)

*Primary Examiner* — C Melissa Koslow
(74) *Attorney, Agent, or Firm* — Novick, Kim & Lee, PLLC; Allen Xue

(57) ABSTRACT

A method for preparing a magic-sized nano-crystalline substance, wherein a component containing at least one metal element of groups IIB, IIIA and IVA in the periodic table, and a component containing at least one non-metal element of groups VIA and VA are used as raw materials. In a reaction system for preparing a conventional nano-crystalline substance and in an inert gas atmosphere, after heating the reaction, reactants are cooled to a temperature 50% lower than the actual heating temperature of the reaction thereof, and after standing, the target product of the magic-
(Continued)

sized nano-crystalline substance is obtained. The required pure target product can be obtained by the preparation method.

11 Claims, 17 Drawing Sheets

(51) Int. Cl.
*H01L 21/02* (2006.01)
*B82Y 40/00* (2011.01)
*B82Y 30/00* (2011.01)

(52) U.S. Cl.
CPC ............... *B82Y 30/00* (2013.01); *B82Y 40/00* (2013.01); *C01P 2002/72* (2013.01); *C01P 2002/84* (2013.01); *H01L 21/0256* (2013.01); *H01L 21/02557* (2013.01); *H01L 21/02562* (2013.01); *H01L 21/02601* (2013.01)

(56) References Cited

OTHER PUBLICATIONS

Qiyu Yu et al., "Study of Magic-Size-Cluster Mediated Formation of CdS Nanocrystals: Properties of the Magic-Size Clusters and Mechanism Implication" J. Phys. Chem. C, 2009, vol. 113, pp. 12766-12771.

Emily A. Weiss, et al, "The Use of Size-Selective Excitation to Study Photocurrent through Junctions Containing Single-Size and Multi-Size Arrays of Colloidal CdSe Quantum Dots" J. Am. Chem. Soc., 2008, vol. 130, pp. 83-92.

* cited by examiner

METHOD FOR PREPARATION OF MAGIC-SIZED NANO-CRYSTALLINE SUBSTANCE

TECHNICAL FIELD

The present invention relates to the method for preparation of magic-sized nano-crystalline substance in the field of nanomaterial.

BACKGROUND ART

Quantum dot is a semiconductor nanocrystal, and has increasingly drawn widespread concern in materials science field. The meaning of nanocrystal mentioned in the context is same to that of quantum dot. Current investigations show that the atom numbers in the nanocrystal are ranging from a dozen to thousands, and the nanocrystal is a subsphaeroidal micro-particle, with a size of 1-20 nm, that is smaller or close to the Bohr radius of excitons in its material. Thus, the exciton movement is directly limited by the sphere size, and the confinement effect is obvious. Nanocrystal properties such as light, electricity, magnetic, catalysis, etc., are mostly and directly depended on one parameter size, and this single correlation provides great convenience for adjusting the nanocrystal properties. In addition, nanocrystals have a large specific surface area, and its surface atom numbers are close or even more than those in the interior, thus, the surface structure is closely related to the properties of its materials. By modification on the surface of semiconductor nanocrystals, the relevant properties can also be improved, and thus the features such as special photoelectric properties and easy modification can be awarded. As a new material with easy modification properties, the material can have wide application prospects in many fields including medicine, energy sources, physical elements, such as solar battery, biological imaging, light-emitting diode, etc. For example, in 1994, Bawendi, Paul Alivisatos, etc. firstly used nanocrystals of cadmium selenide in LED field; in 1998, Alivisatos and Shu-Ming Nie reported that the use of nanocrystals in biological tags and biosensors was realized, respectively; in 2002, J. Nozik reported that the use of nanocrystals in solar battery was accomplished.

In 1980s, the synthesis of nanocrystals (NCs or conventional nanocrystals RNCs) was set about and developed, such as synthesizing in the aqueous solution system, synthesizing in the organic medium system, and synthesizing in the mixed system of water/nonpolar solvent using soft templates (such as reversed-phase micelles and micellar emulsion, etc.) and so on. Currently, the synthetic method of nanocrystals is becoming more mature, and compared with the early development stage of nanocrystals, the synthetic technology used in the prior art is rather excellent, and organic solvents of high boiling point are used in the synthesis. The component containing Cd, Pb, Zn, In, Ga and other metal elements of groups IIB, IIIA and IVA in the periodic table, and the component containing S, Se, Te, P, As and other non-metal elements of groups VIA and VA are used as raw materials, respectively. Amongst, typical nanocrystal substances more investigated and reported are CdSe, PbSe, ZnTe, CdS, CdTe, etc. At present, nanocrystals are synthesized and prepared mainly by colloid chemistry, that can be divided into two main types. One is the most successful method for synthesizing nanocrystals in oil phase, that is the hot-injection method for efficient preparation of high-quality nanocrystals provided by Bawendi group in 1993. That is, organic cadmium was used as the source of cadmium, the source of Se was activated by the organic phosphine lignin trioctylphosphine (TOP), selenylated tributylphosphine was rapidly injected to the solution of trioctylphosphineoxide (TOPO) at high temperature of 300-330° C. (as surfactant, ligand and solvent), and then the mixture was reduced to about 250-300° C., and allowed to react for different time, to wait for the nucleation of CdSe nano-crystalline and formation of nanocrystals. High uniform CdSe nano-crystalline was prepared, that effectively improved the control of particle size distribution in the synthesis, and the nanocrystal product of CdS, CdSe, CdTe, etc. had already been synthesized. In 2001, Peng et al introduced CdO and other cadmium compounds stable in air to substitute dimethylcadmium as cadmium precursor, that avoided using toxic, dangerous, and expensive dimethylcadmium, and made the reaction conditions be simple (without requiring strict anhydrous and oxygen-free conditions, and effectively reducing the reaction temperature). In 2002, Peng's group used oleic acid (OA) and octadecene (ODE) as ligand and non-coordinationg solvent, respectively, and thus effectually enlarged the raw materials of nanocrystals and the solvent scope (W. William Yu, X. Peng, et al. Formation of high-quality CdS and other II-VI semiconductor nanocrystals in non-coordinating solvents: tunable reactivity of monomers, *Angew. Chem. Int. Ed.*, 2002, 41, 2368-2371).

Another synthetic method was the "non-hot-injection one-pot" reported by Cao's group in 2004. In this method, powdered sulfur was used as the sulfur source, and tetradecanoic acid cadmium as the cadmium source, to which was added non-coordinating octadecene, and nanocrystallines grew in a reaction bottle at 240° C. However, for this method, the synthetic temperature is high, and the reaction speed is rapid, that made the nucleation and the production process of CdS nanocrystals be linked together, and it is hard to carefully investigate the growth conditions of nanocrystals. Since hot-injection occurs at high temperature, and the nucleation and the production process of nanocrystals in the method of "non-hot-injection one-pot" link together, the nanocrystals obtained by these methods are mostly large size NCs products, and magic-sized nano-crystal substances are rarely observed.

Magic-sized nano-crystalline substances, also called magic-sized nanoclusters (MSNCs), are a special type of nanocrystallines, and a series of substances found in the preparative system of CdSe, CdTe, ZnSe, etc. Its particle size is rather small, in the range of 1-3 nm, constituted of only dozens of atoms, and compared with routine nano-crystalline substances (RNCs), said substances have sharper UV absorption peak. In the UV absorption spectrum and the fluorescence emission spectrum, peak types with more narrow half peak width are observed, the half peak width is <30 nm (generally 10-15 nm), and during the process of formation, peak positions in absorption spectrum cannot shift, but only peak height is changed due to the difference of amount. Since MSNCs cannot be easily purified, and prone to polymerization, it is hard to make a characterization (Emily A. Weiss, et al, The Use of Size-Selective Excitation To Study Photocurrent through Junctions Containing Single-Size and Multi-Size Arrays of Colloidal CdSe Quantum Dots. *J. Am. Chem. Soc.* 2008, 130, 83-92).

Firstly, MSNCs are the magic-sized CdSe nano-crystallines synthesized in water phase by A. Henglein in 1984. In 2007, CdO was dissolved in dodecylamine and nonanoic acid by Manna et al., to which was added TOPSe, and CdSe MSCs F330 (with a UV absorption maximum at 330 nm), F360, F384, F406, F431, F447 were successively synthesized at 80° C.

In 2008, Pan et al reported the synthesis of MSCs with a UV absorption peak at 311 nm (F311) using two-phase synthesis method, and thought that the substance with said single size is the nuclei of routine nano-crystalline (RNCs), but they did not obtain the sample only containing F311. In 2009, Yu reported in his article the presence of MSCs with an absorption peak at 323 nm (F323), and described that after addition of ethanol, F323 would gradually declined, and the absorption of RNCs at 309 nm and 347 nm (F309 and F347) had an trend of increasing, but did not specify their relationship, as well as the amount of synthesized F323 is relatively small [Yu, Q.; Liu, C. Study of Magic-Size-Cluster Mediated Formation of CdS Nanocrystals: Properties of the Magic-Size Clusters and Mechanism Implication. *J. Phys. Chem. C* 2009, 113, 12766-12771]. In 2010, Parak et al synthesized the mixture of CdS MSCs with several different absorption peaks by keeping the constant temperature of 80° C., and observed that CdS MSCs could always grow from 303 nm to 387 nm in discrete form. After that, Weiss, Robinson, Yang, Yu, et al successively reported the discovery and the research on F303 and F387, F311 and F322, as well as F324, etc. As for the investigation of CdTe MSNCs, there are only the following reports, and that is, Quanqin Daisy reported F433 in 2007 in Nanotechnology, Kui Yu et al reported F427, F500, F550, F600 in 2009 in Chem. Common., and Sandra J. et al reported F445 and F483 in 2010 in Chem. Mater. Taken together, the reports on efficient synthetic methods of purified magic-sized nano-crystalline substances are very limited.

Contents of the Invention

Aiming directly at above conditions, in order to thoroughly research, develop and utilize the magic-sized nano-crystalline substances (MSNCs), the object of present invention is to provide a method for preparation of MSNCs. Since the magic-sized nano-crystalline substances (MSNCs) are found in the process of investigating and preparing routine nano-crystalline substances (RNCs), the preparative method of MSNCs according to the present invention can be carried out using the same reaction system with the preparation of RNCs, i.e., a component containing at least one metal element of groups IIB, IIIA and IVA in the periodic table, and a component containing at least one non-metal element of groups VIA and VA are used as raw materials. In a same reaction system for preparing RNCs and in an inert gas atmosphere, the reactants are heated for reaction, with following elementary procedures:

1': Performing the reaction by heating; to the predetermined reaction temperature, the reaction time is preferably 5-30 min;

2': After completion of reaction, the reactants are cooled to a temperature 50% lower than the actual heating temperature of the reaction thereof, and after standing, the target products of corresponding magic-sized nano-crystalline substances (MSNCs) are obtained. The half peak width of peaks in UV absorption spectrum for the target product of MSNCs is usually 10-20 nm.

Wherein, the preferable reaction temperature is 40%-80% of the reaction temperature used for corresponding routine nano-cystalline substance preparation. The molar ratio of said metal element and said non-metal element is (4-8):1.

According to the available reports, when RNCs of different compositions are prepared, the needful reaction temperature was different, for example, currently, the reaction temperature for preparation of CdS RNCs and CdSe RNCs can be respectively 300° C.-330° C. and 240° C.-300° C., thus those mentioned in above preparative methods of the present application are 40%-80% of the reaction temperature used for corresponding RNCs. The reaction temperature for preparation of CdTe MSNCs or CdSe MSNCs can be generally <140° C. (such as 80° C.-120° C.); for CdS MSNCs of the present invention, the reaction temperature is generally <190° C. (such as 90° C.-180° C.).

In above preparative method, after heated for reaction at said reaction temperature, the reactants are cooled to a temperature 50% lower than the actual heating temperature of the reaction thereof before standing. In general, said cooling and standing temperature should be below 30° C. or room temperature, and preferable cooling and standing mode is firstly cooled −18° C.-liquid nitrogen temperature (the abbreviation "liquid nitrogen" in the present invention denotes the temperature conditions of liquid nitrogen), and then further warmed to the temperature of ≤30° C. Experimental results indicate that these preferable cooling and standing conditions/modes are more beneficial to obtain corresponding products of MSNCs and/or more single products of MSNCs.

In above preparative method, said choosing and usage modes, that a component containing at least one metal element of groups IIB, IIIA and IVA in the periodic table, and a component containing at least one non-metal element of groups VIA and VA are used as raw materials, can at least be similarly accordant to the modes of RNCs that have already been researched and/or reported recently. A composition of a component containing one metal element of said group IIB and a component containing one non-metal element of group VIA (such as CdSe, PbSe, ZnTe, CdS, etc.) is used; or a composition of a component containing one metal element of said group IIIA and a component containing one non-metal element of group VA (such as InP, GaAs, etc.) is used; or a composition of a component containing one metal element of said group IVA and a component containing one non-metal element of group VIA is used; or a composition of three or four components called nanocrystalline alloy is used, in which one or two components containing group IIB and/or IIIA metal element are comprised, as well as one or two components containing group VIA and/or VA non-metal element are comprised (such as CdTeSe, CdZnSe, CdZnSSe, etc.).

Based on above mention, as far as above related raw materials are said, said metal elemental components may preferably choose and use organic acid salts or inorganic acid salts of metals including Cd, Pb, Zn, In, Ga; said non-metal elemental components may preferably choose and use the single component or compounds including S, Se, Te, P, As.

As for the solvents used in the reaction system, on the basis of using various solvents allowed to prepare RNCs, and under the preconditions of not expelling to use various solvent systems that has successfully applied in the preparation of RNCs, the present invention preferably recommends using the high boiling-point organic solvents used in the high-temperature oil phase reaction, including such as octadecene, oleic acid or oleyl amine, trioctylphosphine. Amongst more recommendatory reaction system solvents are respectively oleic acid-octadecene mixed solvent in which the volume ratio of octadecene is ≤30%, or are oleyl amine-octadecene mixed solvents in which the volume ratio of octadecene is ≤30%.

Further investigation shows that in above preparative method of the present invention, the adjustment or the change of including the feed ratios of corresponding metal/non-metal constituents in raw materials, the reaction temperature, the solvent constitution of reaction system, the use of additive agents, and the conditions/circumstances of cooling and standing after completion of reaction, can provide the target MSNCs with different stable degree, formation speed and/or yield, as well as the transformation of different MSNCs and so on.

For example, corresponding to RNCs that have already been more researched and reported at present, the main preferable conditions of preparing the target products MSNCs with corresponding constituents by above preparative method of the present invention include:

when the target product CdTe MSNCs is prepared, the molar ratio of components Cd and Te in raw materials is ≥4:1, the reaction temperature is 120° C.-160° C., and after completion of reaction, the temperature for cooling and standing is from room temperature to liquid nitrogen temperature;

when the target product CdS MSNCs is prepared, the molar ratio of components Cd and S in raw materials is ≥4:1, the ratio of oleic acid and cadmium equals 2.2:1, the reaction temperature is 120° C.-240° C., the preferable reaction temperature is 190° C., and after completion of reaction, the temperature for cooling and standing is −20° C.-80° C.;

when the target product CdSe MSNCs is prepared, the molar ratio of components Cd and Se in raw materials is ≥4:1, the reaction temperature is 120° C.-160° C., and after completion of reaction, the temperature for cooling and standing is the liquid nitrogen temperature (196° C.).

In above preparative method, after reaction at heating temperature, the reactants can be directly cooled to said temperature before standing, and if appropriate, suitable additive agents can be added to the reactants. In addition, after completion of reaction, the reactants are diluted in organic solvents including toluene or cyclohexane in a volume ratio of 1:(100-150), and then cooled and stand. Said additive agents are selected from the group of acetone, ethyl acetate (EA), acetic acid, methanol, ethanol, chloroform, tetrahydrofuran (THF), water, ethylamine; preferable additive agents can be methanol, ethanol, THF, and EA. The addition amount of said additive agents is generally not more than ½ of reactant volume and depends on the detailed conditions.

When cooling and standing are carried out by diluting the reactants in organic solvents including toluene or cyclohexane, as appropriate, the diluent solvents can also contain suitable amines. Said amines are butylamine, octylamine, dodecylamine, oleyl amine and/or are alcohols components including methanol, ethanol, isopropanol, hexanol, decanol or are tetrahydrofuran and/or carboxylic acids. When amines are used, the preferable volume ratio of amines and diluent solvents is 1:(60-150).

When the reactants are diluted in toluene or cyclohexane for cooling after completion of reaction as well as separating or without separating from the resultant RNCs products, except for using the single toluene or cyclohexane, the mixed solution of toluene or cyclohexane with suitable additive agents can further be used. Said additive agents can be amines components including butylamine, octylamine, dodecylamine, oleyl amine and/or are alcohols components including methanol, ethanol, isopropanol, hexanol, decanol or are tetrahydrofuran.

Using above preparative method of the present invention can directly prepare corresponding purer products of MSNCs, that not only is convenient for deep research on MSNCs, but also comparing with RNCs, MSNCs have sharper UV absorption. Although at present, MSNCs' photoluminescence efficiency (PLQY), stability and so on have certain distance to that can be directly used, strong absorption occurs. It is possible to realize good PLQY and stability by adjusting surface factors such as defects, ligands, etc. Meanwhile, it is shown that MSNCs can convert to more stable RNCs at room temperature, and thus a new way for preparation of RNCs is developed, while low-temperature synthesis can have efficient controlling properties, and the operation is simple. Thus, that is more advantageous for industrial application, and for further deep research on the reaction mechanism.

In the following, combined with examples as shown in figures, using the target products of MSNCs, corresponding to the typical RNCs that have more researches and reports at present, as an example, above contents of the present invention is further illustrated. But it should not be understood that above subject scope of the present invention is only limited to following examples. Without departing from above techniques and spirits, various alternates or changes made according to the ordinary technical knowledge and commonly-used means should all be included in the scope of the present invention.

DESCRIPTION OF FIGURES

FIGS. 1, 2a-2c, 3a-3b, 4, 5, 6 are the detection spectra of products in example 1.

FIGS. 11a1, 11a2, 11b1, and 11b2 are micrographs of products in example 3, 11a3 and 11b3 are X-ray diffraction patterns of products in example 3.

EXAMPLES

Example 1 Preparation of Magic-Sized CdTe Nano-Crystalline Substances (CdTe MSNCs)

Experimental Reactants:

cadmium acetate dihydrate ($Cd(Ac)_2$), powdered tellurium (Te), trioctylphosphine (TOP), oleyl amine (OLA) are all purchased from Aldrich; toluene, methanol, ethanol, and isopropanol are all available from Chengdu Kelong Chemical Reagent Factory; hexanol, decanol, octadecene (ODE), butylamine, octylamine, dodecylamine are all from Aldrich.

Detection Apparatus:

TECHCOMP UV 2310IIultraviolet spectrophotometer is bought from Shanghai Techcomp Science and Technology Instrument.

Fluoromax-380 Fluorescence Spectrometer

I. Preparation:

According to the way and requirement for preparation of routine CdTe quantum dot (CdTe RNCs), 0.2345 g $Cd(Ac)_2$ and 3 g OLA (oleyl amine) were weighed and added to a three-necked round bottom flask, vacuum-nitrogen were exchanged for more than three times during heating to 80°

C., then the reactants were warmed to 120° C., and vacuumed for 2 h at 120° C. Additional 0.0281 g Te and 0.3264 g TOP (trioctylphosphine) were weighed and added to another round bottom flask, vacuuming and nitrogen-protection were exchanged three times at room temperature, and water and oxygen in the system were drawn out. Then, the reactants were warmed to 300° C. under protection of nitrogen, till the solution in the bottle became transparent green yellow liquid. The liquid was cooled to the room temperature, to which was added 1.4114 g OLA. After uniformly mixed, Te TOP was added to the solution of $Cd(Ac)_2$ at 120° C. The heating reaction started from the temperature of 120° C., and the sample at different temperature and time was taken out for detection.

II. Effect of Reaction Temperature

1. The reaction was carried out under the conditions that the concentrations of Te in the reaction system were 10 mmol/kg, 30 mmol/kg, 44 mmol/kg, respectively, and No. 1 sample was respectively taken out after kept at 120° C. for 15 min, then the reactants were heated for reaction, and No. 2-7 samples were respectively taken out at 0 min and 15 min of 140° C.; 0 min and 15 min of 160° C.; 0 min and 15 min of 180° C. The absorption spectral results measured for each sample were shown in FIG. 1 (each curve from down to up in figure respectively corresponds to the UV absorption spectra of No. 1-7 samples). The wavelength of UV adsorption peak at 443/493 nm did not shift.

Figure 1:
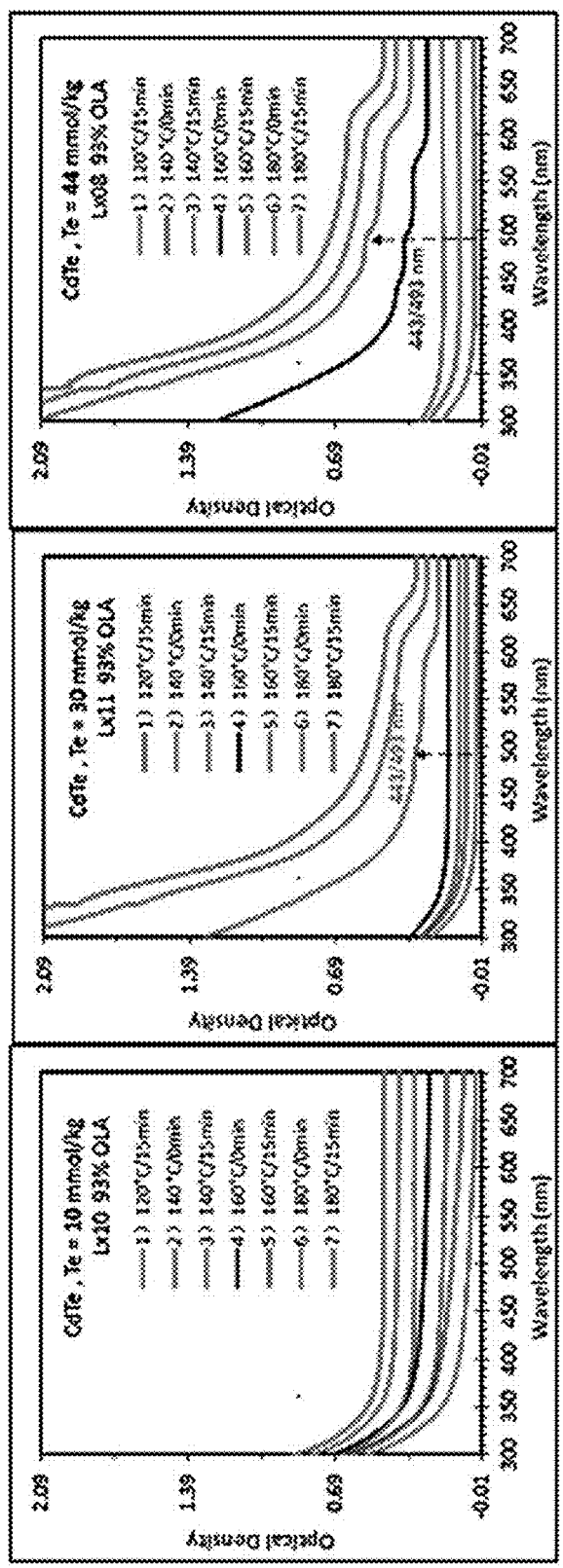

As shown in FIG. 1, it can be seen that when the concentration of Te is 10 mmol/kg, each sample doesn't display any phenomenon;

When the concentration of Te is 30 mmol/kg, No. 1-4 samples do not show any phenomenon. No. 5 sample shows the absorption peaks of MSNCs RNCs at 443 nm (F443) and 493 nm (F493). When heating to 180° C., No. 6 and 7 samples only show RNCs;

When the concentration of Te is 44 mmol/kg, No. 4 sample shows the presence of F443, F493, and RNCs. No. 5 sample also shows the presence of F443 and F493, as well as RNCs, whose amounts are also more than those of 30 mmol/kg. No. 6 and 7 samples only show the presence of RNCs.

2. During the process of above reactions, samples were respectively taken out at different temperatures and stored in toluene by dispersion, the conditions of detecting UV absorption spectra are:

The phenomenon of sample at 15 min of 140° C. stored in toluene: when standing in toluene for 0 h and 3 h, RNCs were not produced; for 6 h, F421 appeared; for the phenomenon of 9 h and 21 h, MSNCs caused the growth process of continuous red shift, and finally, the peak position stabilized at F451 nm.

For the sample at 0 min of 150° C., at first, no RNCs are found in toluene; after 3 h, more F421 is produced, and subsequently in the system, MSNCs caused the growth process of continuous red shift, and after 21 h, the peak position stayed at F455 nm.

For the sample at 15 min of 160° C., at first, MSNCs and RNCs are found.

For the sample at 0 min of 180° C., only RNCs are found.

3. TOPTe was respectively i) added to the reactants of Cd-OLA at 140° C., and allowed to react for 3 min; ii) and allowed to react for 10 min at 140° C. and iii) added at room temperature. Then, the resultant mixtures were all stored in an environment of 30° C. constant temperature.

Results: TOPTe was added at room temperature and stood at room temperature, till 7 h RNCs were not found. TOPTe was added at 140° C., and after mixed, the sample was taken out and stationarily stored in a condition of 30° C., till 7 h RNCs were not found. After TOPTe was added at 140° C., the mixture was allowed to react for 10 min before taking the sample, and after taken out, RNCs were not found; after storage for 3 h in a condition of 30° C., F365 was found; after storage for 7 h at 30° C., F365 red shifted to F370.

Above experiments showed that MSNCs were prone to be produced at low temperature, and after the temperature was elevated (such as ≤180° C.), it is more advantageous for the existence of RNCs.

III. Effect of Stationary Storing Conditions on the Sample at Room Temperature

1. Effect of Storing Way

Above experiments showed that when the concentration of Te was 44 mmol/kg, MSNCs were found earlier, thus the experiment was carried out at Te concentration of 44 mmol/kg:

No. 1-8 samples were respectively taken out that reacted at 120° C. for 15 min; that reacted at 140° C. for 0 min, 5 min, and 15 min; that reacted at 150° C. for 0 min; that reacted at 160° C. for 0 min, 10 min, 20 min, and the samples were respectively allowed to stand at room temperature and after diluted in toluene, the samples were allowed to stand for different times, to investigate the effect of standing circumstance on MSNCs. The results were shown in FIG. 2. In the figure, a is the UV absorption spectrum of sample that was allowed to directly stand for 2 h before it was placed in toluene to store for 2 h; b is the UV absorption spectrum of sample that was allowed to directly stand for 8 h, and c is the UV absorption spectrum of sample that was diluted in toluene and kept for 8 h after taken out. From down to up, each curve in FIG. 2 successively corresponded to the UV absorption spectra of No. 1-8 samples, respectively. The wavelength of UV adsorption peak at 347/365 nm did not shift.

Figure 2:
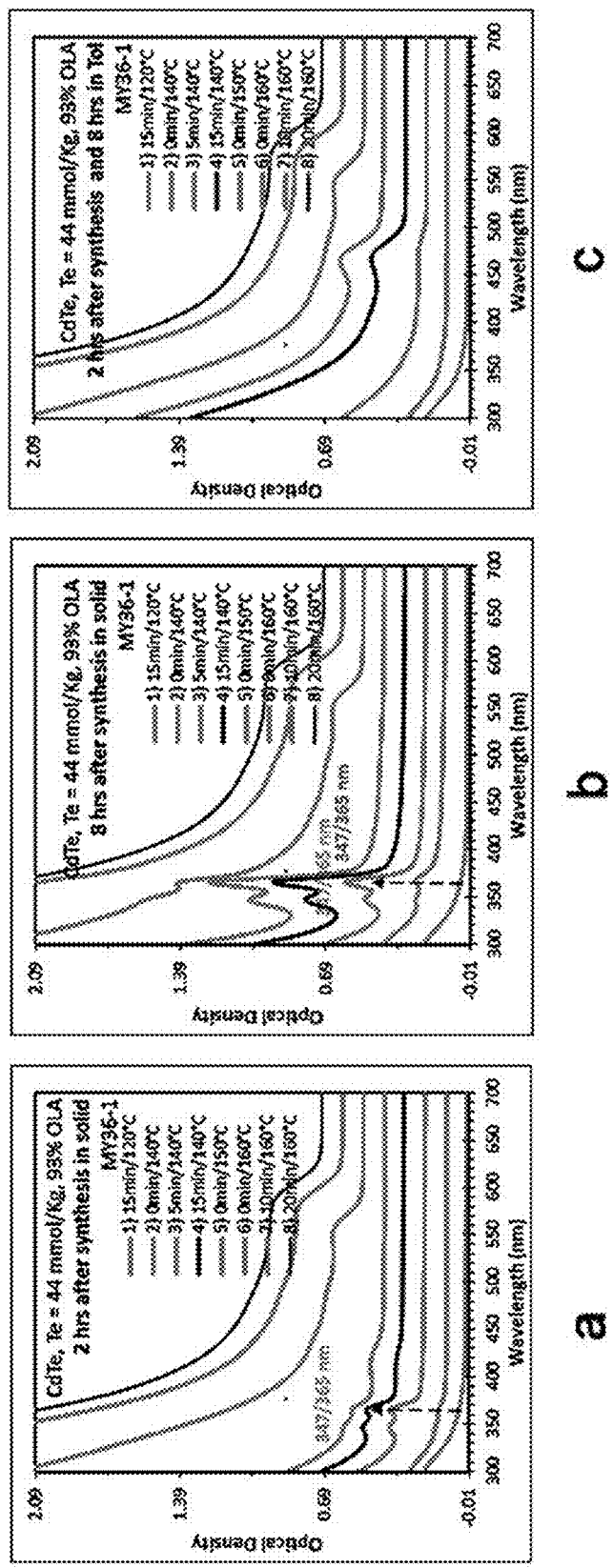

FIG. 2 shows that storing at room temperature is beneficial for the growth of MSNCs with a small volume.

2. Storing in Toluene

Figure 3:
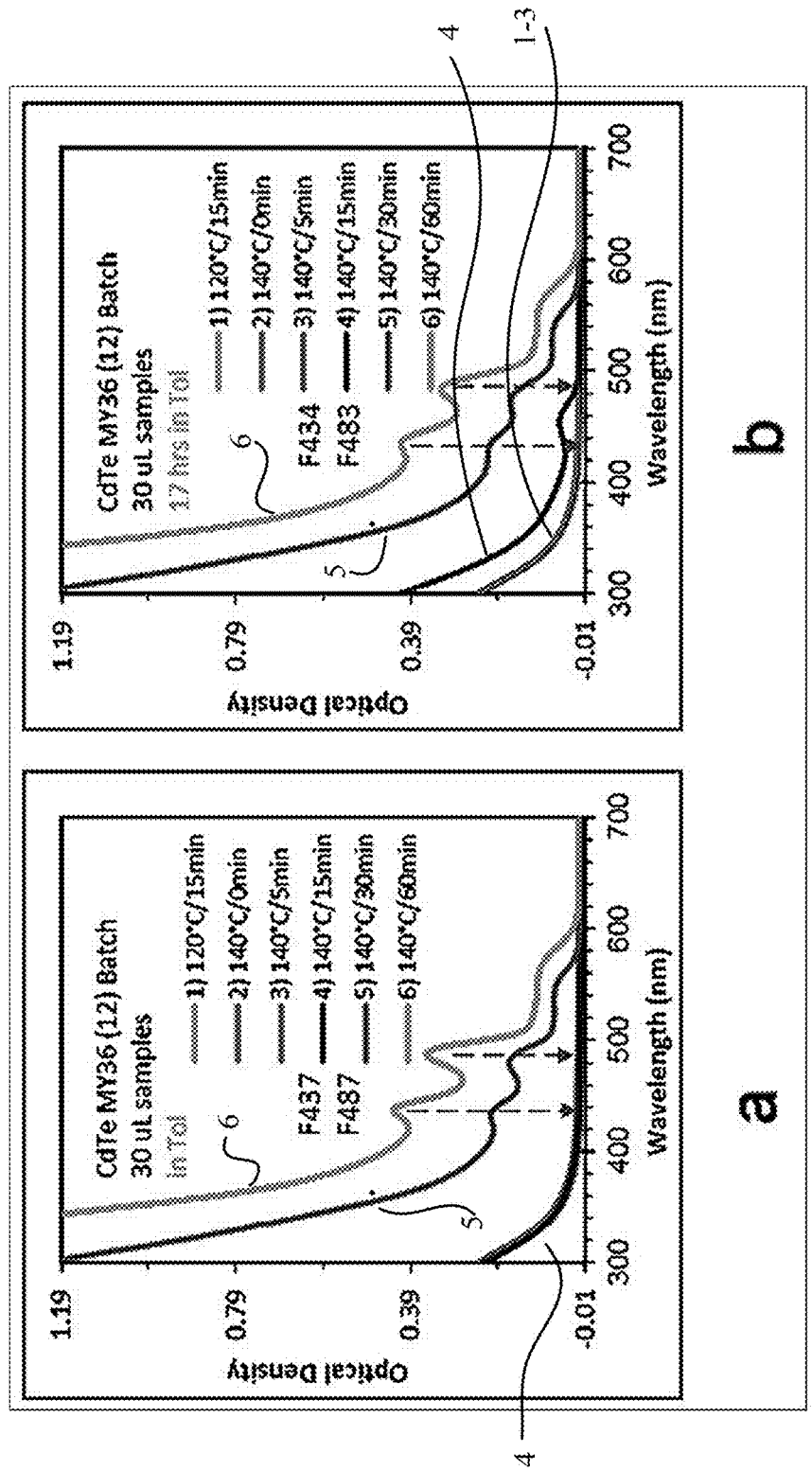

Since in the process of reaction, after heating to ≥160° C., only RNCs were mainly found, No. 1-6 samples were taken out at 15 min of 120° C., as well as at 0 min, 5 min, 15 min, 30 min, 60 min of 140° C. in the process of heating reaction, and after taking it out, the sample was respectively diluted in toluene for detecting UV absorption. Results are shown in FIG. 3. From down to up, each curve in the figure are respectively the UV absorption spectra of No. 1-6 samples. In the figure, a is the absorption spectrum of each sample in toluene (curves of No. 1-4 samples are overlapped), and b is the absorption spectrum of each sample after stored in toluene for 17 h (curves of No. 1-3 samples are overlapped).

As shown in FIG. 3, in figure a, No. 1-4 samples do not show the presence of RNCs, No. 5 and 6 samples show the presence of F437, F487, and RNCs, and the amounts of NCs in No. 6 sample are all more than those in No. 5 sample; in figure b, after stored in toluene for 17 h, No. 1-3 samples still do not show the presence of RNCs, No. 4 sample shows the presence of RNCs, and compared with figure a, the amounts of F437 and F483 in No. 5 and 6 samples are reduced, while the amount of RNCs do not obviously change.

3. Effect of the Amount of Additive Agent OTA

Figure 4:
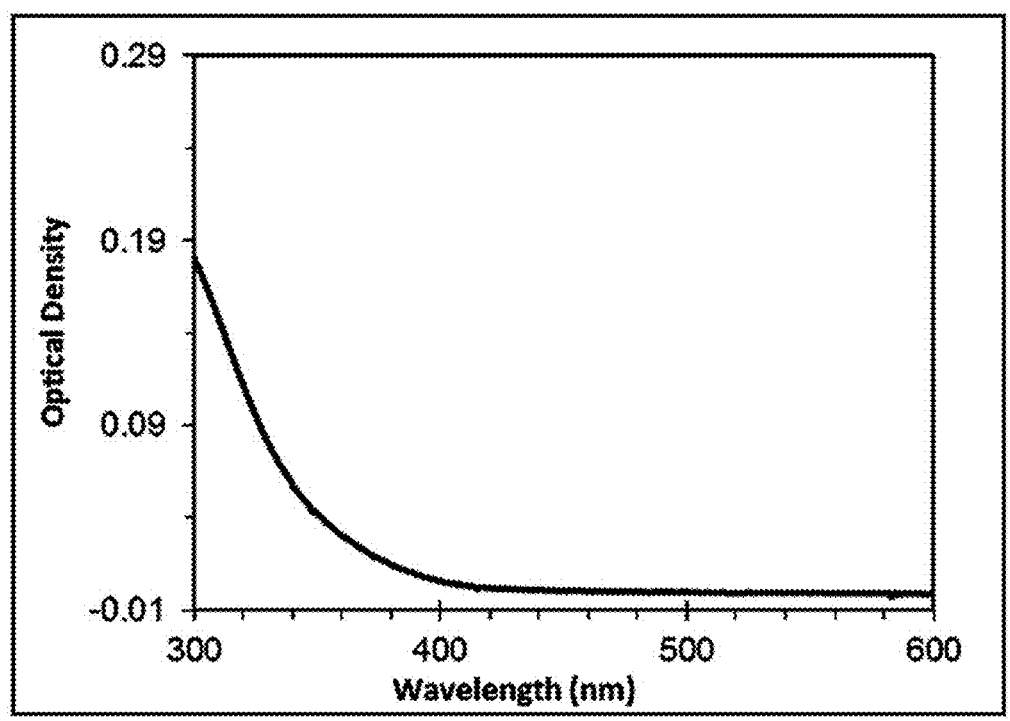

In addition, the UV absorption of reactant samples that was taken out after reacting at the temperature of 130° C. for 5-30 min was detected, and as shown in FIG. 4, the samples do not show any characteristic absorption. The sample was placed in liquid nitrogen for storage.

Figure 5:
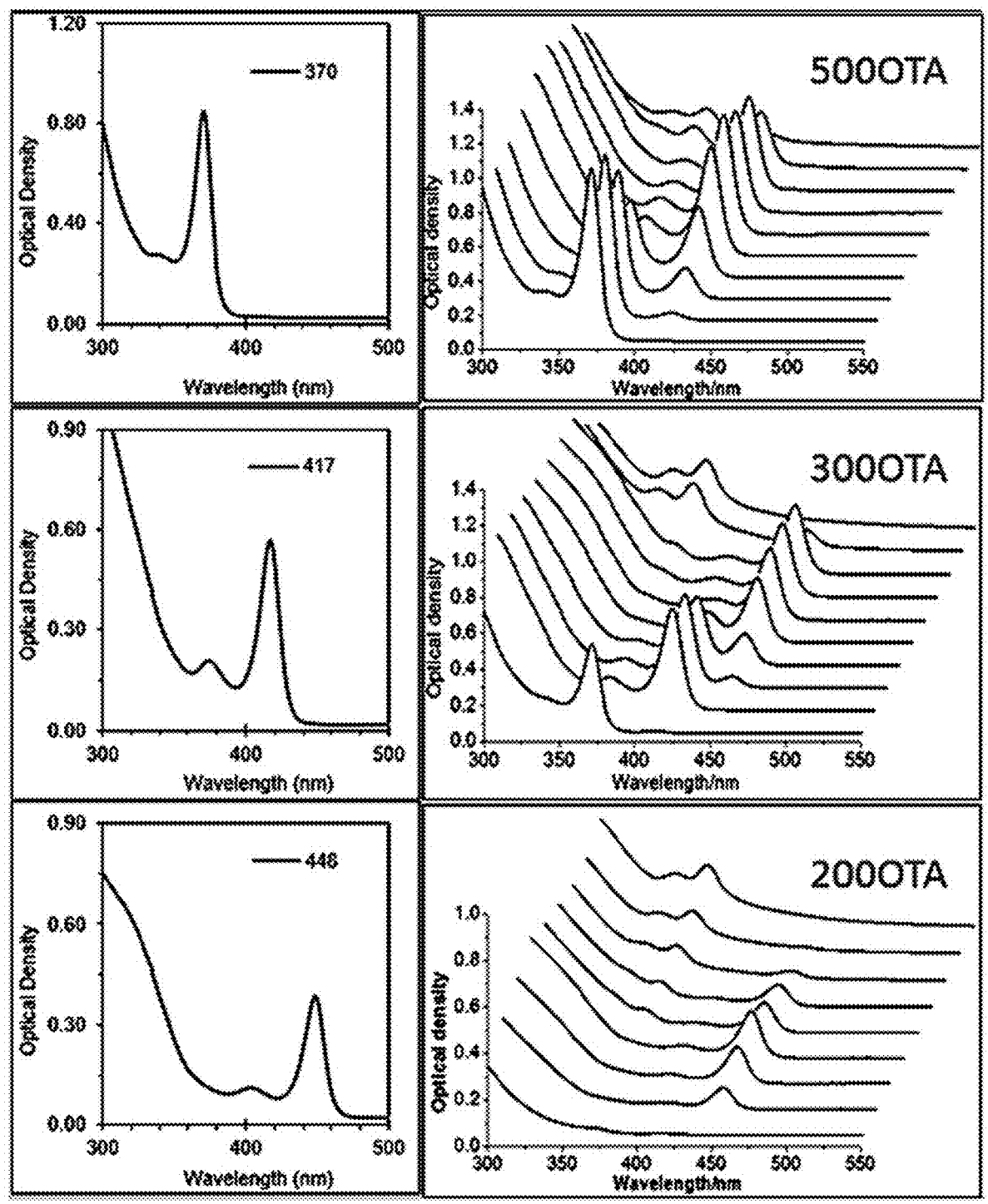

30 μL intermediate frozen in liquid nitrogen was taken out, to which was added the mixed solvent of 1.5 mL octylamine and 1.5 mL toluene, and results are shown in FIG. 5: after 10 min, MSNCs product of pure F370 (absorption peak at 370 nm) was obtained, as shown in above figure, and its peak is sharp with a narrow half peak width. If the mixed solvent of 0.5 mL octylamine and 2.5 mL toluene was added, after 2 h, MSNCs product of pure F417 was obtained, as shown in figure; If 0.1 mL octylamine and 2.9 mL toluene were added, after 10 min, MSNCs product of pure F448 was obtained, as shown in following figure. On the left of the main absorption peak of each MSNCs, there are obvious secondary absorption peaks.

Figure 6:
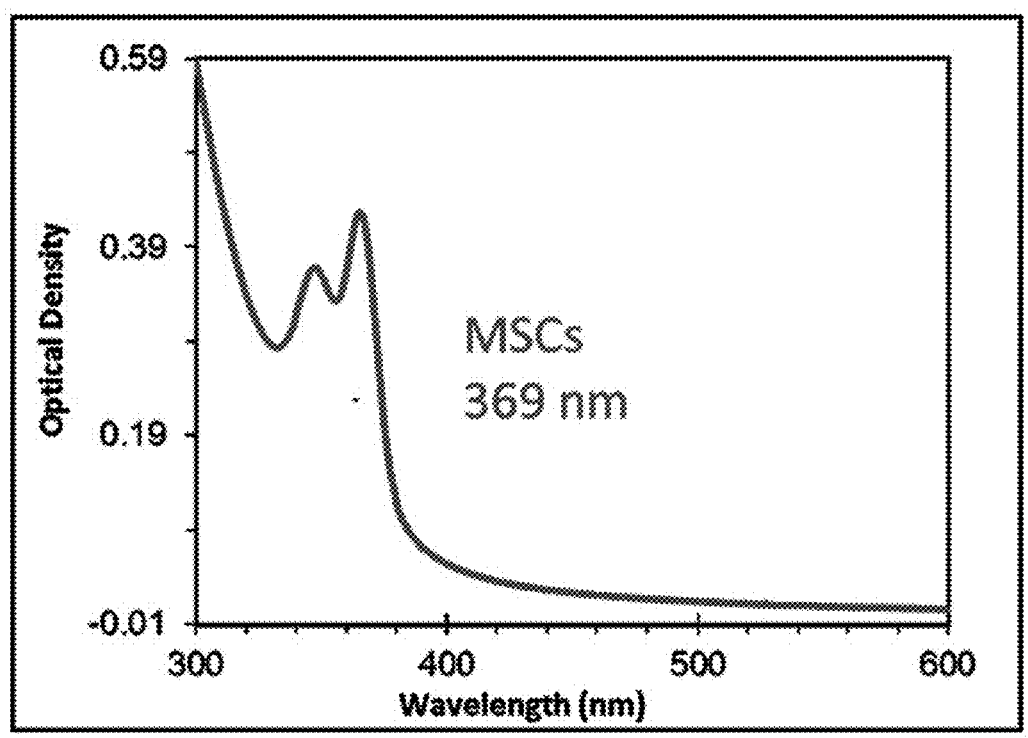

If the sample stationarily stored in liquid nitrogen was directly taken out, it was directly placed at room temperature for 4 h before measurement, and one special MSNCs product of F369 was obtained, as shown in FIG. 6.

Above results showed that by direct crystallization of cooled reactants or crystallization after diluting them in organic solvents, as well as adjusting the constituents and/or the constituent ratio of diluent solvent system, especially the reactants were cooled in liquid nitrogen at first and then warmed (to ≤30° C.), single magic-sized nano-crystalline products with different structures can be respectively obtained from the reactants after they were cooled and stood.

4. Effect of Additive Agents (1) Effect of Amine Types

The mixed solution of 0.5 ml amine (butylamine, octylamine, dodecylamine, oleyl amine, respectively) and 2.5 ml toluene was used for stationary storage of samples. The sample chosen was that at 5 min of 140° C. in above reaction process.

In the mixed solution of butylamine-toluene, once the sample was added to the dispering agent, lots of F372 were produced, reaching to the maximum amount, and the half peak width was narrow, indicating the uniform size of MSNCs; at 5 min, the amount of F372 reduced some but that was not obvious; after 20 min, the amount of F372 was almost not changed, accompanied by the presence of F415.

In the mixed solution of octylamine-toluene, after addition of the sample, likewise, lots of F372 was immediately produced, but its amount was less than that in butylamine solution; after 20 min, the amount of F372 was close to that in butylamine, and at the same time, F416 was found; after 1 h, the amount of F372 reached the maximum, and exceeded that in butylamine, and meanwhile, the growth of F416 was obvious, but at this time, F372 was still predominant; after 3 h, the amount of F372 decreased, while the amount of F416 increased; after 6 h, the amount of F416 exceeded that of F372.

In the mixed solution of dodecylamine-toluene, after addition of the sample, F372 was also immediately found, and its amount was more than that in octylamine solution at 0 min; after 5 min, F416 was found, but the amount of F372 reached the maximum; after that, the amount of F372 slowly decreased, but the amount of F416 increased; after 3 h, the amount difference of F372 and F416 was not big.

In the mixed solution of oleyl amine-toluene, at 0 min after addition of the sample, F372 was also immediately found, and its amount was less; at 5 min, the amount of F372 reached the maximum, accompanied by the presence of F416; in the following process, F372 in the system was continuously reduced, but F416 increased, and after 3 h, the amount of F416 exceeded that of F372.

Above results showed that addition of the amine constituents can promote the produce of MSNCs. For the presence of F372, butylamine and octylamine played an important role, while butylamine had a good stabilization for F372. In the circumstance containing amines, among MSNCs, F416 was a stable product, and the amine with longer carbon chain can make the presence of F416 become earlier. Thus, by choosing different amine constituents as the additive agent, different MSNCs products can be selected to produce.

(2) Effect of Alcohol Types

In above reaction process, the sample at 10 min of 140° C. was stationarily stored in the mixed solution of alcohol-toluene in a volume ratio of 1:149, in which the alcohol was selected from the group of methanol, ethanol, isopropanol, hexanol, and decanol. Results indicated that compared with the mixed solution containing amines, using the amine additive agents can be prone to form smaller-size MSNCs, but in the solution of alcohol additive agents, it was prone to produce larger-size MSNCs.

Further experiments indicated that in the circumstance containing alcohols especially methanol and ethanol, whatever the additive amount of alcohols was, the results were all the first presence of F447, and after that, stable larger-size RQDs would be slowly formed.

Example 2 Preparation of Magic-Sized CdSe Nano-Crystalline Substances (CdSe MSNCs)

Experimental Reactants:
1) cadmium acetate dihydrate ($Cd(OAc)_2 \cdot 2H_2O$): purchased from Alfa Aesar, with a purity of 99.999%;
2) Powdered selenium (Se): purchased from Alfa Aesar, with a purity of 99.5%;
3) trioctylphosphine (TOP): purchased from Aldrich Chemistry, with a purity of 90%;
4) oleyl amine (Oleylamine): purchased from Aldrich Chemistry, with a purity of 70%.

Experimental Apparatus:
1) U-4100 spectrophotometer;
2) F-7000FL fluorescence spectrometer.

I. Preparation:

According to the way and requirement for preparation of routine CdSe quantum dot (CdSe RNCs), 0.1599 g cadmium acetate dehydrate (0.6 mmol) and 3.000 g oleyl amine were added to the round bottom flask with straight condenser, stirring was started at room temperature, and degassing operation was performed using vacuum pump. After the air bubble vanished, nitrogen was purged, then the degassing operation was repeated. As such, nitrogen/vacuum operations were carried out in turn for three times, and finally the vacuum state was kept. The reactants were warmed to 80° C., and vacuumed for 1 h at this temperature. In the heating process, cadmium acetate dihydrate gradually dissolved to obtain the clear solution. After completion of this operation, the reactants were further warmed to 120° C., and vacuumed for 1 h at this temperature. At this time, the solution presented the pale pink transparent status. Then, nitrogen was purged to keep the atmosphere and obtain corresponding Cd precursor.

According to the total reaction system of 5 g and the ratio of cadmium/selenium/trioctylphosphine (90%), after weighing, powdered selenium, 90% trioctylphosphine, and oleyl amine were added to 25 mL round bottom flask with straight condenser, stirring was started at room temperature, and using vacuum pump, nitrogen/vacuum exchange operation was repeated for three times, similar to the preparation of cadium source. At this time, the solution presented the colorless transparent status, and then, nitrogen was purged to keep the atmosphere and obtain corresponding Se precursor.

Se precursor was rapidly transferred into Cd precursor only one time, and the addition time was recorded as the starting point of reaction. To the reaction system, nitrogen was purged to remain the atmosphere. The reactants were respectively kept at certain temperature, the sampling operation was performed using certain time, and the spectrum was correspondingly measured; and at the temperature range of 120° C.-240° C., the following heating experiment was completed, i.e. after reacting at 120° C. for certain time, the sample was taken out, then after the reactants was heated to 140° C. as temperature programming, the sample was further taken out, and after successively heating to 240° C., sampling was finished.

Each sample was diluted in toluene, and corresponding detection and characterization were performed using UV spectrophotometer.

II. Effect of Different Molar Ratio of Cd/Se in Reactants at Different Reaction Temperature on Results 1. In above reactions, keeping certain concentration of Se precursor and changing the feeding molar ratio of Cd/Se, it was found that low Cd/Se ratio can produce more kinds of CdSe MSNCs in shorter time. Results were shown in FIG. 7. In the figure, a and b are the UV absorption spectrum of each sample with molar ratios of Cd/Se being 1/1 and 4/1, respectively. From down to up, each curve in the figure is the UV absorption spectrum of No. 1-8 samples taken out at 15 min of 120° C., 15 min and 0 min of 140° C., 15 min and 0 min of 160° C., 15 min and 0 min of 180° C., 15 min of 200° C. (in figure a, the curves of No. 1 and 2 samples are overlapped, the curves of No. 3 and 4 samples are partly overlapped; in figure b, the curves of No. 1-4 samples are overlapped).

Figure 7:
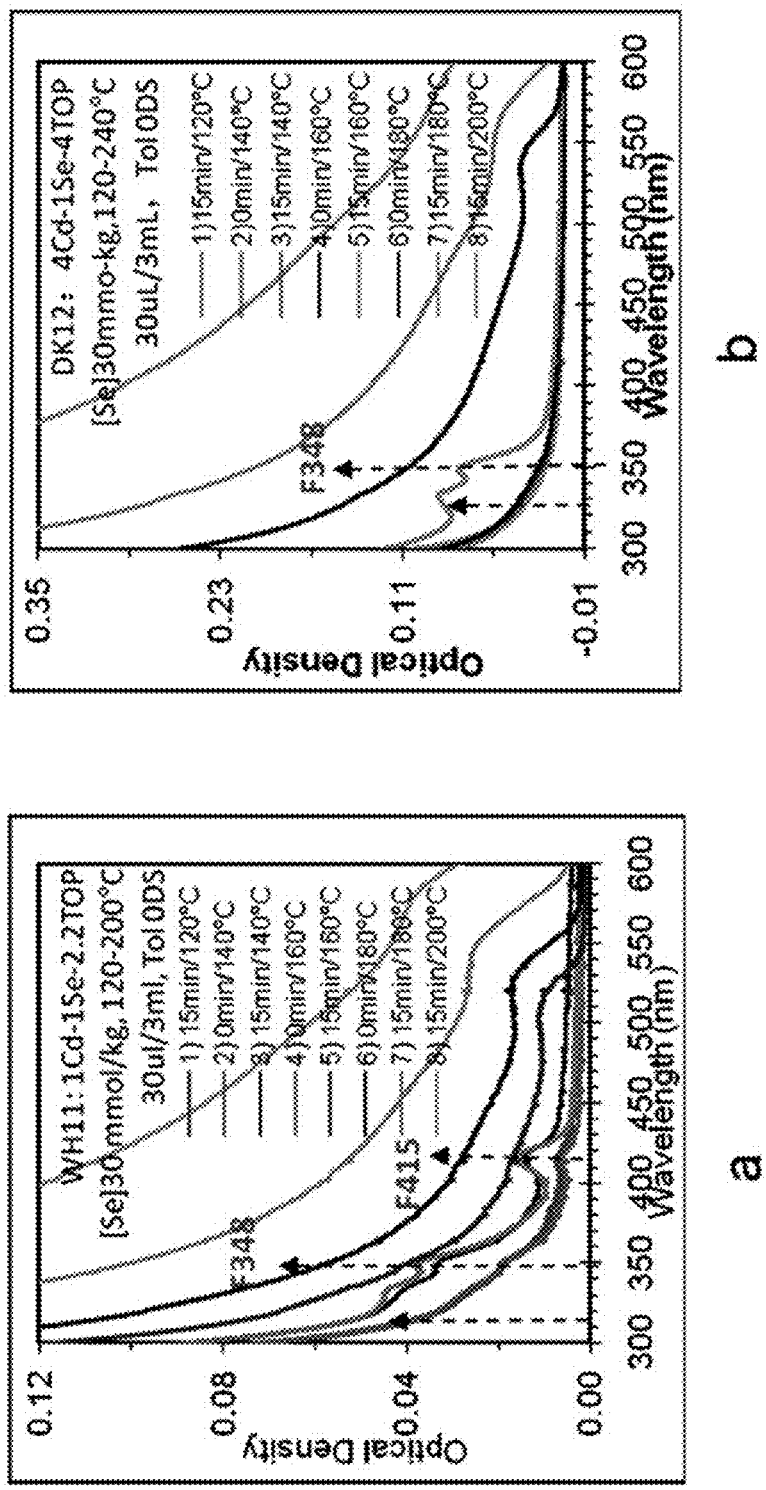
FIGS. 7a-7b, 8a-8b, 9a-9b, are the detection spectra of products in example 2.

From FIG. 7, it can be seen that when the reaction temperature was gradually elevated to certain degree (>180° C.), CdSe MSNCs were not found in the products, while CdSe RNCs became the main product. The lower reaction temperature of 120° C.-160° C. can make the formation of MSCs earlier, and the amount was also more.

2. After placed at room temperature for 15 min, above No. 5 sample of 15 min/160° C. and No. 6 sample of 0 min/180° C. were further dispersed in toluene for detection, and the results showed that when the content of RNCs almost remained unchangeable, the growth of F415 MSNCs was more obvious, indicating that the growth and formation of MSNCs are independent of the growth of CdSe RNCs, and both of them were independent at the growth stage of crystalline.

III. Effect of Stationary Storage Circumstances

1. Effect of Additive Agents

Figure 8:
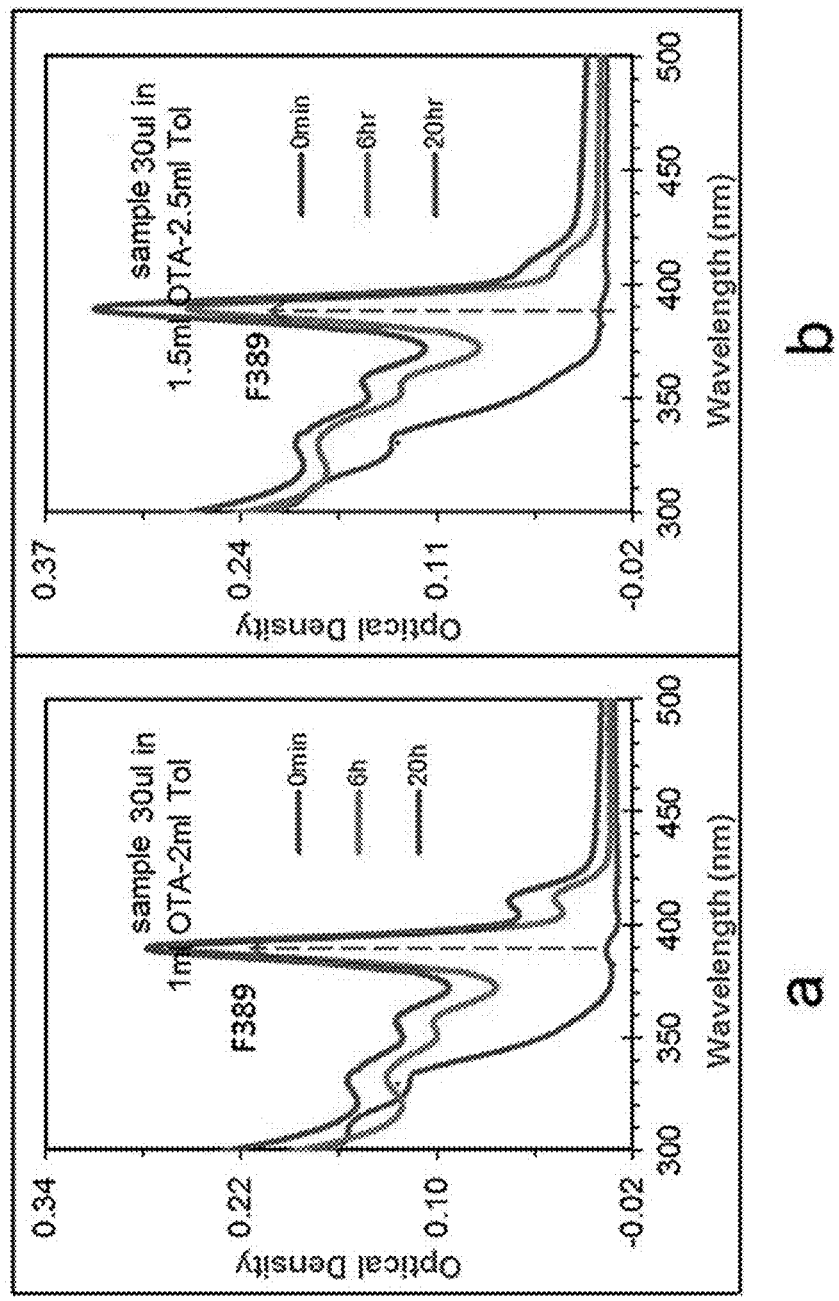

At the temperature of 15° C., the sample at 0 min of 160° C. in above reaction was respectively stood in two kinds of octylamine-toluene mixed solution with different ratio, i.e. 1 ml OTA+2 ml Tol and 1.5 ml OTA+2.5 ml Tol, and the detection results of UV absorption spectrum are shown in FIG. 8. In the figure, a and b are two kinds of octylamine-toluene mixed solution with different ratio, i.e. 1 ml OTA+2 ml Tol and 1.5 ml OTA+2.5 ml Tol. From down to up, each curve in the figure is the UV absorption spectrum of sample standing for 0 min, 6 h, 20 h, respectively. It can be seen that increasing the concentration of octylamine in the mixed solution of octylamine-toluene can be beneficial for improving the formation amount of MSNCs.

VI. Effect of Cooling and Standing Temperature

Figure 9:
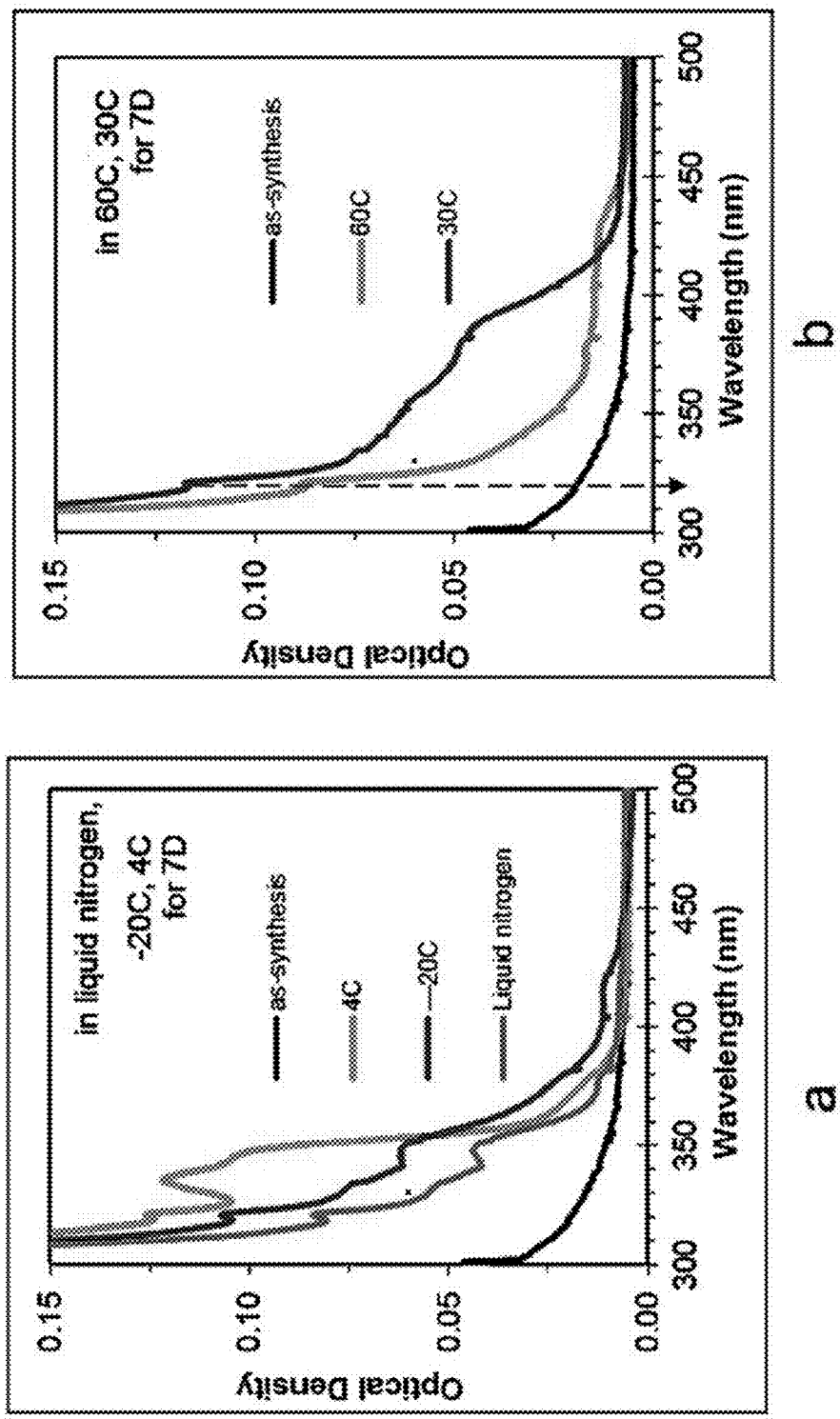

The reactant sample taken out at 15 min of 200° C. was directly allowed to standing in liquid nitrogen, at −20° C., 4° C., 30° C., and 60° C., and stored for seven days, and the UV absorption spectra measured were shown in FIG. 9. From down to up, each curve in figure a corresponds to the samples stored in liquid nitrogen, −20° C., and 4° C.; From down to up, each curve in figure b corresponds to the samples at synthetic temperature, as well as stored at 60° C. and 30° C.

The results in FIG. 9 showed that after cooling and standing, the sample taken out at 15 min of 200° C. could provide MSNCs and RNCs, but if stationarily stored in lower temperature (<4° C.), the sample would be prone to providing F311 and F348 MSNCs, while the temperature was higher (>30° C.), it was more beneficial for the growth of larger-size RNCs.

Example 3 Preparation of Magic-Sized CdS Nano-Crystalline Substances (CdS MSNCs)

Experimental Reactants:

Cadmium oxide (≥99.99%), oleic acid (≥90%), octadecene (≥90%), purchased from Aldrich; powdered sulfur (≥99.5%), cyclohexane (≥99.5%), toluene, isopropanol (≥99.7%), methanol (≥99.5%), available from Chengdu Kelong Chemical Reagent Factory.

Experimental Apparatus:

TECHCOMP UV 2310II ultraviolet spectrophotometer (Shanghai Techcomp Science and Technology Instrument); Fluoromax-380 fluorescence spectrometer; X'Pert Pro MPD X ray diffractometer (XRD); Tecnai G2 F20 S-TWIN field emission transmission electron microscope (TEM); Zeta-sizer Nano apparatus.

I. Preparation:

According to the way and requirement for preparation of routine CdS quantum dot (CdS RNCs), the raw material was prepared with the molar ratio of Cd:OA:S being 4:8.8:1.

At first, the stock solution of cadmium oleate (Cd:OA=4: 8.8) was prepared. 13.2 mmol oleic acid (OA) and 6 mmol cadmium oxide (CdO) was added into 5 g octadecene (ODE), the mixture was degassed and deoxidated at 40° C., and after the air bubble vanished, the mixture was heated to 120° C. and the vacuo heating was kept for 1 h. The vacuum condition was substituted by nitrogen atmosphere, and then the mixture was heated to 230° C., and kept for 10 min at 230° C.; then, the mixture was heated to 250° C., and kept for 10 min (the solution was clear and transparent); the mixture was cooled to 120° C., and the vacuum state was kept for 30 min; the mixture was further cooled to 80° C., $N_2$ atmosphere was used, and then the mixture was cooled to room temperature and stored for use.

Preparation of nano-crystallines: 6 mmol above cadmium oleate and 1.5 mmol powdered sulfur were added to suitable amount of octadecene (the total amount of the system was 5 g), and the vacuum state was kept for 30 min at 40° C.; the mixture was heated to 120° C., the vacuum state was kept for 30 min and changed to $N_2$ atmosphere, then the sample was taken out at the predetermined time; the temperature range of heating was 120° C.-240° C., and certain temperature was kept for certain time; the sample stood certain time at room temperature, and thus CdS MSNCs of F311 and F322 were obtained.

Figure 10:
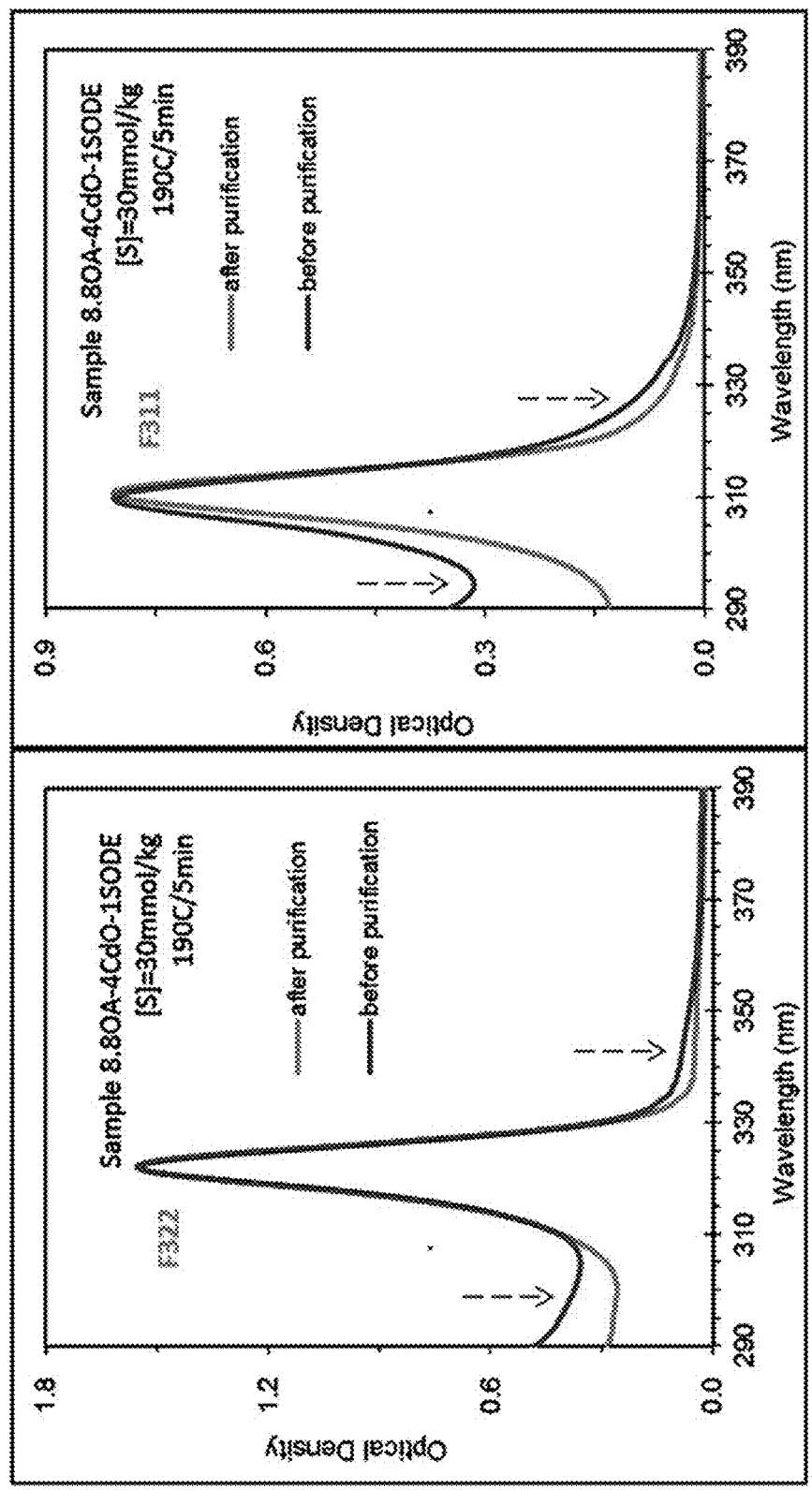
FIGS. 10a-10b are the detection spectra of products in example 3.

Purification of sample: at the presence of sample and excess isopropanol (such as the v/v ratio was about 100:1), the sample of F311 or F322 to be purified was dropped into isopropanol. When dropping, there was a need for fully stirring using glass rod, and it could be observed that the solid precipitated (if the solid was too big, it could be crushed by ultrasonic sound). The mixture was centrifugated, and the supernatant fluid was discarded to provide the solid (if necessary, the solid could be washed again by the same way), which was quickly vacuumed to remove the residual solvent (isopropanol). The purified sample was further dispersed in toluene or cyclohexane, CdS MSNCs with a unchangeable UV absorption peak could be obtained, as shown in FIG. 10. In UV absorption spectra, a corresponds to the absorption peak of CdS MSNCs F322 dispersed in toluene; b corresponds to the absorption peak of CdS MSNCs F311 dispersed in cyclohexane. In the figure, from down to up, curves are respectively the absorption peak of samples after purification and before purification. It was shown that by purification process, the substance at around 290 nm and the larger-size RNCs at around 330 nm were basically removed.

Figure 11:
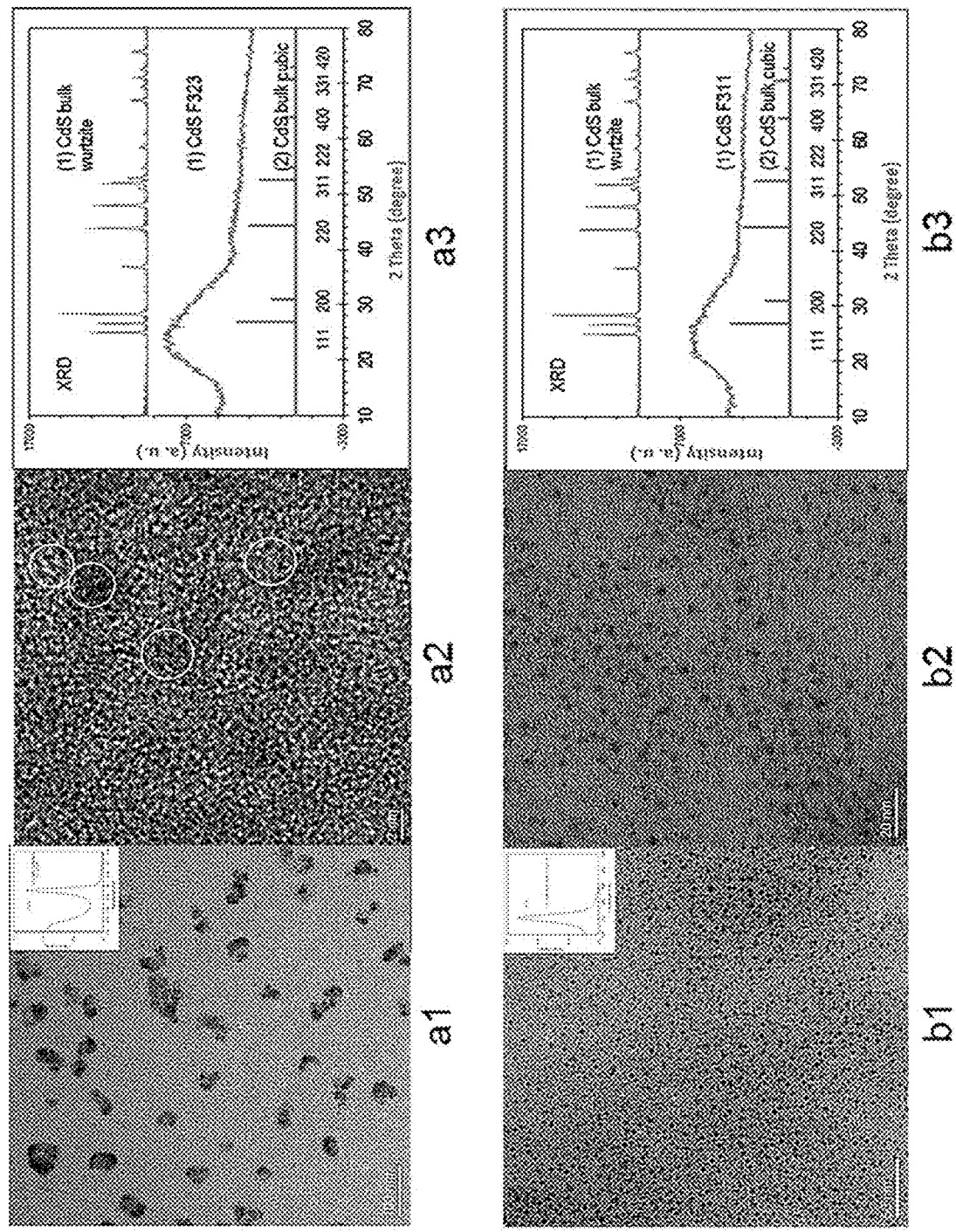

FIG. 11 showed the test results of high-resolution electron microscopy (TEM) and XRD for the products of single nanocluster F11 and F322 after purification. In the figure, a1 and a2 are respectively the TEM spectra of product F322 (using a resolution of respective 100 nm and 2 nm), a3 is the XRD pattern; b1 and b2 are respectively the TEM spectra of product F311 (using a resolution of respective 50 nm and 20 nm), and b3 is the XRD pattern. The small spectra in figures a1 and b1 are the UV absorption spectra of corresponding products, respectively.

II. Effects of Reaction Temperature 1. 0.9393 g cadmium oleate (about 6 mmol) and 0.0048 g powdered sulfur (about 1.5 mmol) were added into about 4 g octadecene (the total weight of the system was kept 5 g, concentration [S]=30 mmol/kg), and three-necked bottle containing well-mixed reactants was placed in oil bath pan for heating under stirring, to which Schlenk lines were linked. At first, the device was vacuumed at 40° C., heated to 120° C. under vacuum, then the vacuum state was kept for 30 min and changed to $N_2$ atmosphere. After that, the reactants were gradiently heated as the program of 15 min at 120° C., 5 min at 140° C., 15 min at 160° C., 15 min at 180° C., 15 min at 200° C., 15 min at 220° C., and 15 min at 240° C., and the sample was taken out at predetermined time (No. 1-7 samples). After sampling and after standing for one day at room temperature, the UV absorption spectrum of each sample was measured, respectively, and results were shown in FIG. 12. In the figure, a is the results immediately detected after sampling, and b is the results detected after standing for one day at room temperature; in the figure, from down to up, each curve is the UV absorption spectrum of No. 1-7 samples, respectively.

Figure 12:
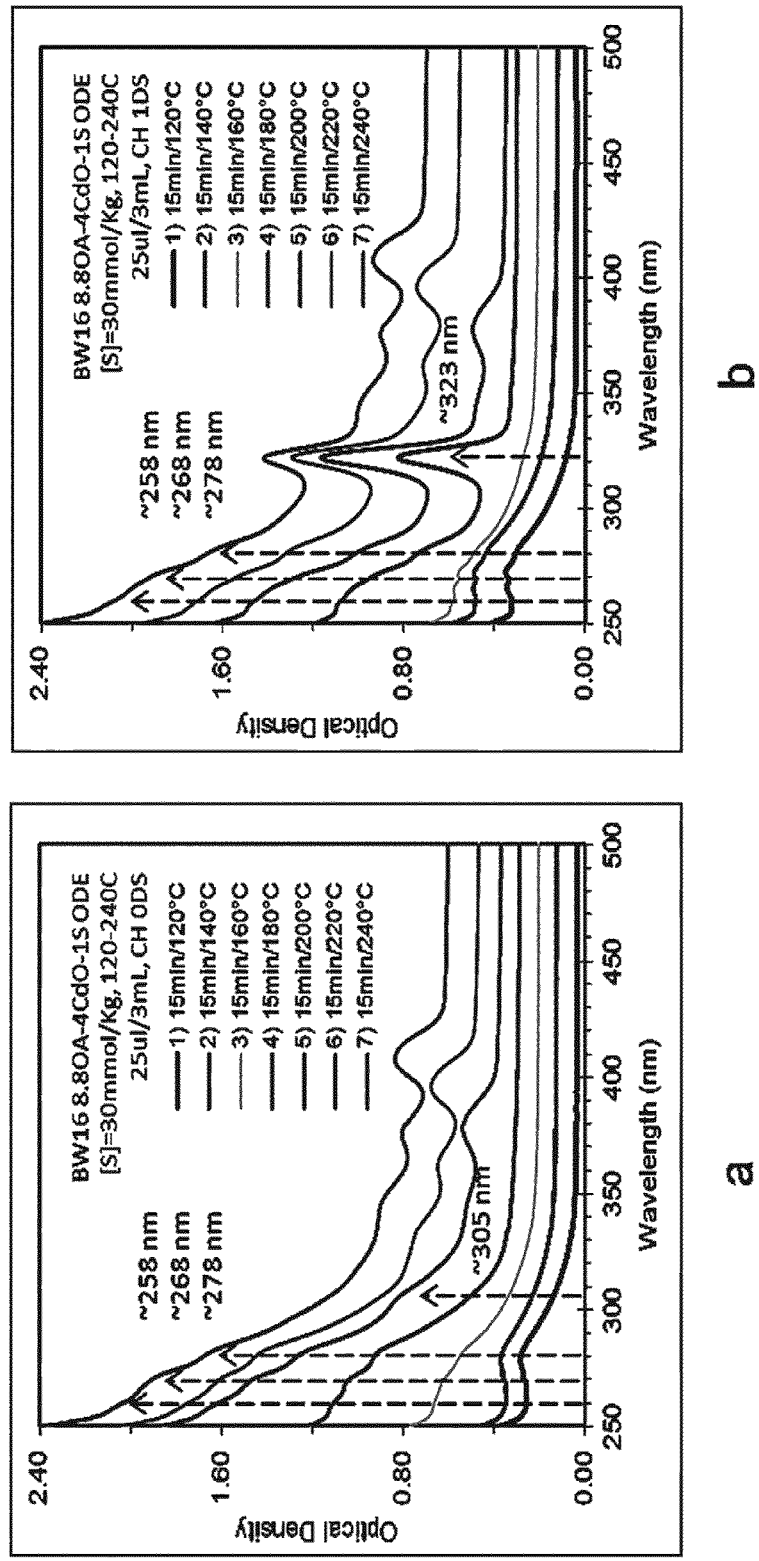
FIGS. 12a-12b, 13a-13e are the detection spectra of products in example 3.

From FIG. 12, it could be seen that in the reaction process of high temperature, the system began to form the RNCs product with an absorption of 350-450 nm at 200° C. or higher temperature (the absorption at 250-300 nm represented the unreacted precursor), without the presence of CdS nano-cluster. After standing for one day at room temperature, it was found that in the sample taken at 15 min of 180° C., there were lots of MSNCs, and whether there were RNCs in the system, after the sample without obvious UV absorption peaks stood for certain time at low temperature, the presence of single smaller-size MSNCs was found in the system, while at this time, the position and the amount of RNCs kept unchangeable. It was indicated that the formation of MSNCs and RNCs was independently carried out. While MSNCs appear at lower temperatures and can grow at room temperature, indicating that MSNCs have lower activation energies than RNCs 2. The raw material containing constituents cadmium and sulfur in a molar ratio of 12:1 and STOP (trioctylphosphine sulfur) were used as sulfur precursor, as well as the raw material containing constituents cadmium and sulfur in a molar ratio of 1:1 and SODE (octadecene sulfur) were used as sulfur precursor, and both of them were prepared as above method. The sample was dispersed in toluene, to measure the UV absorption spectrum. The temperature range for sampling was 120-240° C. Each sample taken out was immediately measured, and then stood at 15° C. for one day, seven days, and ten days. Results distinctly showed that after the reaction temperature reached 180° C., the sample stood at low temperature, and then MSNCs F322 would form in the sample that did not have any absorption. Moreover, after the high-temperature reaction using STOP and SODE as sulfur precursor, the reactants stood at low temperature for different time. Because the activity of STOP was higher than that of SODE, it is easier to produce RNCs using STOP, while relatively low temperature is better for the formation of MSNCs. Thus, in the following experiment, SODE with lower activity was used as the sulfur precursor, and the reaction was carried out at a constant temperature ranging from 180° C. to 200° C.

III. Effect of Cooling and Standing Temperature

Figure 13:
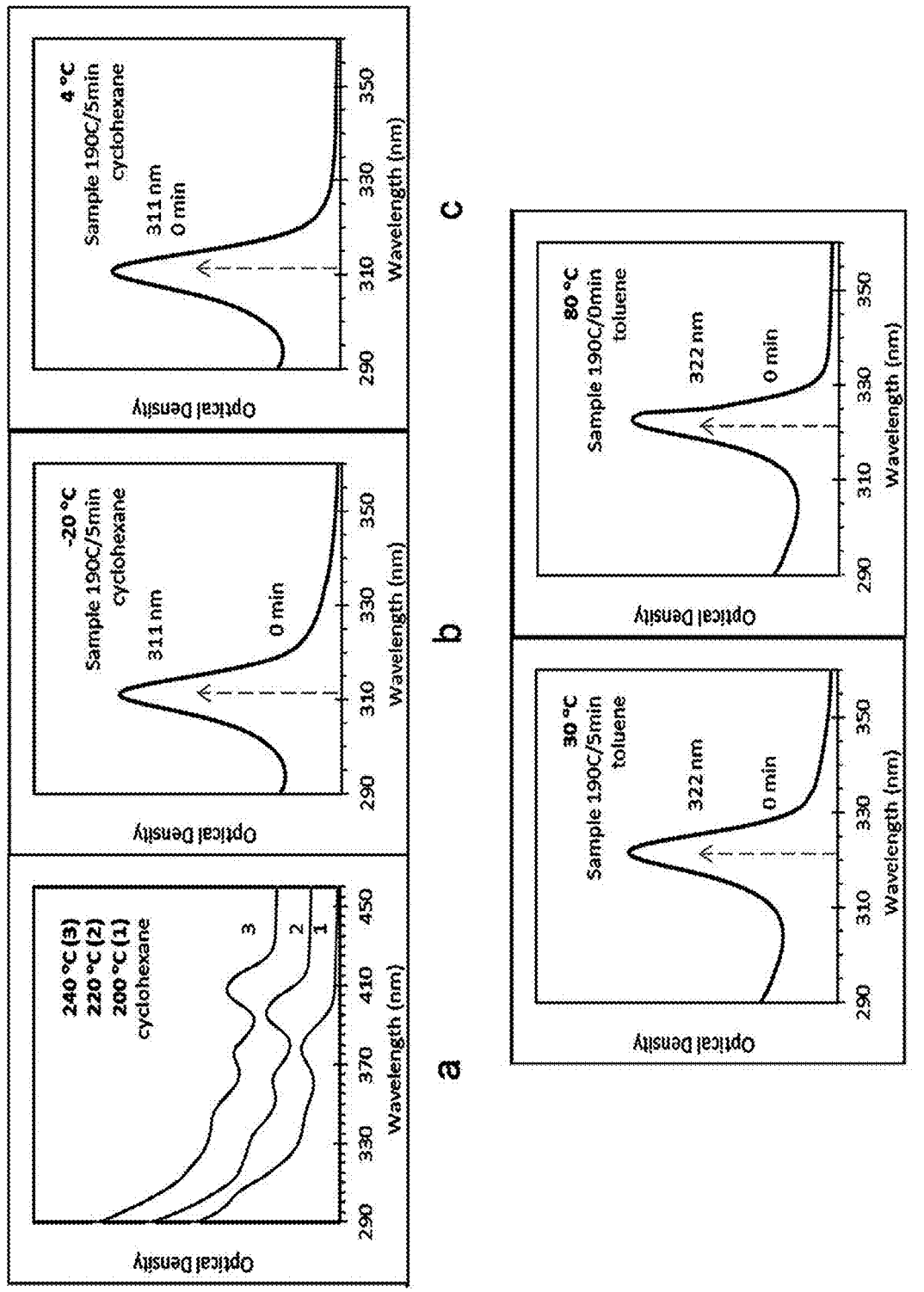

Cd and S in a molar ratio of 4:1 were subjected to the heating reaction, and after high-temperature reaction, a sample without absorption peaks was taken out, and its UV absorption spectra at five temperatures shown in Table 1 were observed, respectively. The results were shown in FIG. 13. In the figure, the sampling temperatures for a were respectively 200° C., 220° C., and 240° C., while the sampling temperatures of b-e were all 190° C.; the samples of a-c were diluted in cyclohexane, and the samples of d-e were diluted in toluene.

TABLE 1

| Products after standing at different temperatures | | | | | |
|---|---|---|---|---|---|
| Standing temperature (° C.) | −20 | 4 | 30 | 80 | 240 |
| Products after standing | After 2-3 days, F311 presents | After one day, F311 presents | After 3-5 h, F322 presents | F322 presents, but after standing for one day, it disappears | Having RNCs, without MSNCs |

Results showed that at lower temperature (≤4° C.), MSNCs F311 was found in the reactants; at higher temperature (30° C., 80° C.), MSNCs F323 could be formed, but at 80° C., F323 could not constantly exist, and finally, it would disappear; for long-time reaction at high temperature (≥180° C.), RNCs would be mainly produced. Consequently, it was indicated that when the storage temperature of sample was lower, the product was prone to being F311; when the storage temperature was elevated to 30° C. or above, the product was prone to being F322. Thus, by regulating and controlling the temperature of cooling and standing, different products of MSNCs can be obtained, respectively.

IV. Effects of Additive Agents

1. Using acetone, ethyl acetate (EA), acetic acid, methanol, ethanol, chloroform, tetrahydrofuran (THF), water, ethylamine and so on as additive agents, the sample and the additive agent were taken out from the reaction (containing unreacted cadmium oleate, ODE, and other solvents) in a ratio of 200 μl sample and 100 μl additive agent, that was placed in the sample bottle for storage at 4° C., 60° C., respectively, before its UV absorption spectra were measured. After preliminary examination, additive agents methanol, THF, and EA with obvious effect were chosen, and the sample in the mixture containing additive agents was stored for 1 h-3 days at 4° C., 60° C., respectively. Results showed that for the sample stored at 4° C., the control group without additive agents produced the stable F323, while the groups containing additive agents methanol, THF could only provide the product of pure F311.

2. Using methanol, THF as additive agents, the sample without UV absorption peak that was prepared at high temperature was dispersed in the mixed solvents of 3 ml toluene+20 µl methanol, 3 ml toluene+50 µl THF, respectively, for successive measurement of UV absorption spectra. Results showed that the control group without the solution of additive agents and the groups containing the solution of additive agents had an identical results, and all of them produced the MSNCs product (F311, F306, F308) F311, but the growth rate was obviously different: the control group without additive agents began to form part of MSNCs after 519-1130 min, while the groups containing additive agents displayed the growth phenomenon at 0 min (just being added), thus the rate improved about 1000 times. It was indicated that although additive agents methanol and THF did not change the growth pathway to form the product F311, they greatly improved the growth rate.

After the amount of additive agent methanol was increased from 5 µl to 100 µl, experimental results showed that the reaction rate could be further improved (the slope of growth graph became bigger and bigger), while for the production amount of MSNCs, containing 50 µl methanol was the best additive amount. After addition of THF, at first, the growth promotion action was obvious, but as the time proceeded, MSNCs could also be decomposed and vanished. For example, the spectrum of product obtained from 50 µl THF group was divided to two parts, i.e. 0-8 min and 8-1872 min, and it could be clearly seen that the products of MSNCs could rapidly grow within 8 min, but they would gradually vanished in 8-1872 min, indicating that THF had dual actions. Thus, it was shown that based on the conditions and the need, by choosing suitable additive agents, MSNCs could be effectively and rapidly obtained and/or different products of MSNCs could be selected.

3. Effect of additive agent on different MSNCs as well as on the transformation rate of MSNCs to RNCs Based on above experiments, the samples taken out at 0 min of 190° C. and at 5 min of 190° C. were respectively placed in the mixed solution of toluene and additive agents methanol and isopropanol, the transformation between F323 and F311, F323 and F308, F323 and F343, F311 and F308 was realized, respectively.

In addition, the product of RNCs was more stable than that of MSNCs at room temperature, thus the transformation between RNCs and MSNCs should be inevitable. Although after CdS MSNCs directly stood at room temperature for longer time (such as about two months), RNCs could be produced, some mixed solutions containing additive agents could help accelerating the transformation of MSNCs to RNCs. For example, it was shown that in the mixed solution of 0.2 ml OLA-2.775 ml Tol, F309 MSNCs was displayed to transform to RNCs after five days; in the mixed solution of 1 ml HAc+1.975 ml Tol, F307 MSNCs was displayed to transform to RNCs after four days; in the mixed solution of 1 ml dioxane+1.975 ml Tol, F310 MSNCs was displayed to transform to RNCs after two days; in the mixed solution of 0.05 ml methanol+3 ml Tol, F308/F311 MSNCs was displayed to transform to RNCs after two days.

Example 4 Preparation of CdTe RNCs Using CdTe F369 MSNCs as Raw Materials

Figure 14:
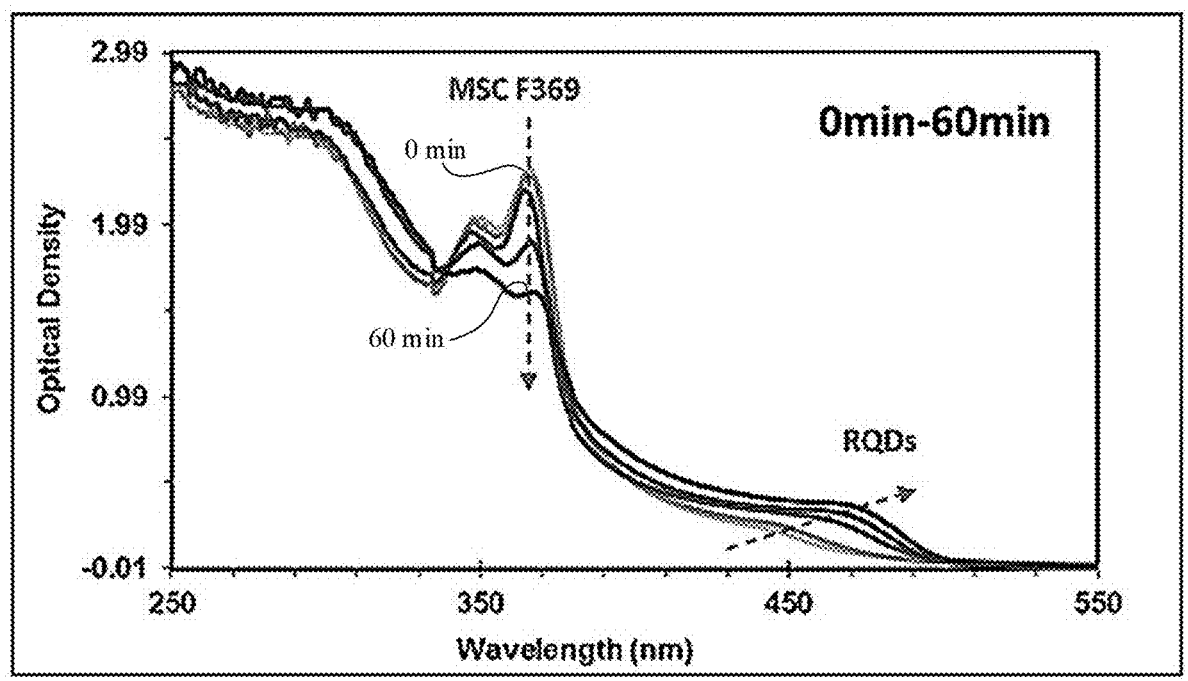
FIG. 14 is the detection spectra of example 4.

Using the way in Example 1, 200 µL pure sample of F369 CdTe MSNCs obtained was dispersed in 1 mL hexane, centrifugated, and the underlayer solid was kept, that was further dispersed in 3 mL toluene and stood. During the standing process of from 0 min to 60 min, the color of solution slowly became yellow, and the amount of F369 gradually declined, while RNCs was gradually formed. The UV absorption spectrum detecting the process was shown in FIG. 14.

Example 5 Preparation of CdS RNCs Using CdS MSNCs as Raw Materials

Figure 15:
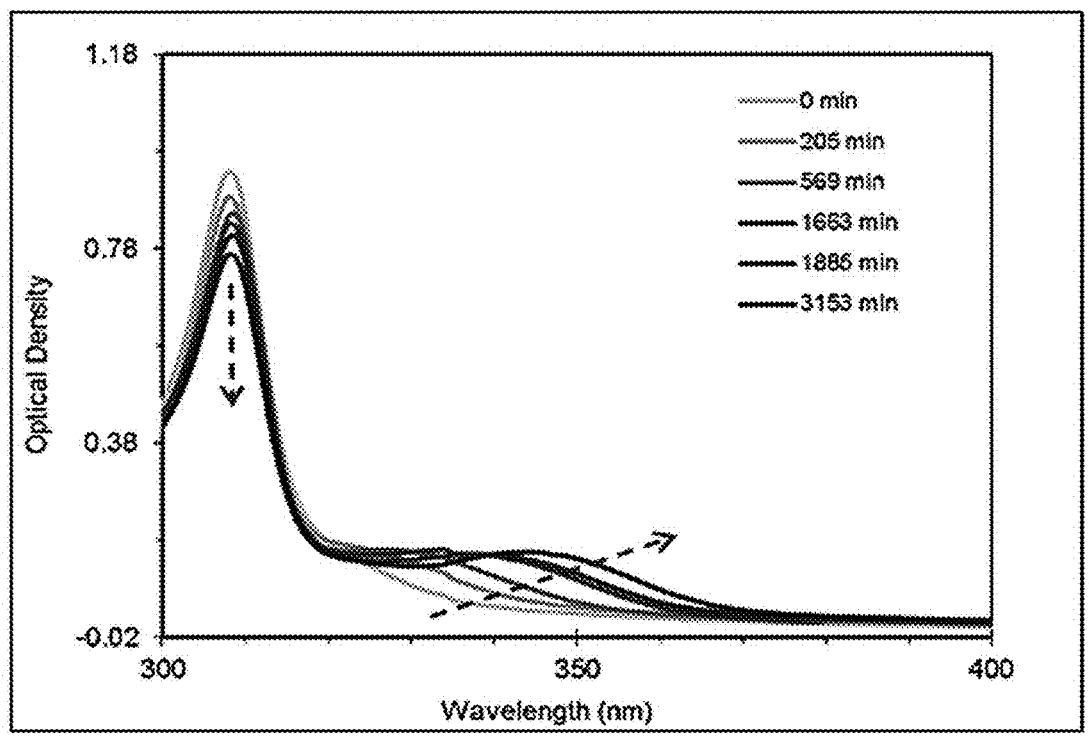
FIG. 15 is the detection spectra of example 5.

Using the way in Example 3, after the reactants that was sampled when heating to 190° C. for 5 min in CdS system were stored in the conditions of −20° C. for one day, the obtained pure F323 CdS MSNCs sample (−0.02 g) was dispersed in 3 mL toluene, to which was added 50 µL methanol, and then the solution was stored in the conditions of room temperature. As the time proceeded, the amount of CdS MSNCs gradually declined, while CdSRNCs was gradually formed. The UV absorption spectrum detecting the process was shown in FIG. 15.

Example 6 Preparation of Magic-Sized CdTeSenano-Crystalline Substances (CdTeSe MSNCs)

Experimental Reactants:
cadmium acetate dihydrate ($Cd(Ac)_2$), powdered tellurium (Te), powdered selenium (Se), trioctylphosphine (TOP), oleyl amine (OLA), and octylamine (OTA), all purchased from Aldrich;
toluene, methanol, ethanol, and isopropanol, available from Chengdu Kelong Chemical Reagent Factory.
Detection Apparatus:
Hitachi U-2910ultraviolet spectrophotometer.
II. Preparation:
1. Preparation of Intermediate
0.160 g $Cd(Ac)_2$ and 4.58 g OLA (oleyl amine) were added to the three-necked round bottom flask, and vacuum-nitrogen were exchanged for above three times in the process of heating to 80° C., then the reactants were heated to 120° C. and vacuumed for 2 h at 120° C. Under the same conditions, two Cd precursors were prepared by heating to 130° C. and 140° C., respectively.

0.019 g Te powder and 0.247 g TOP (trioctylphosphine) were weighed and added to additional round bottom flask, and at room temperature, vacuumed and nitrogen-protection were exchanged for three times, to draw out the water and oxygen in the system. Then, the reactants were heated to 300° C. under the protection of nitrogen, till the solution in the flask became the green yellow transparent solution of TOPTe. After the solution was cooled, TOPTe was added to the solution of $Cd(Ac)_2$ heated to 130° C., and kept for 30 min. The precursor of Te was prepared.

0.012 g Se powder and 0.247 g TOP (trioctylphosphine) were weighed and added to additional round bottom flask, and at room temperature, vacuumed and nitrogen-protection were exchanged for three times, to draw out the water and oxygen in the system. The reactants were warmed with hair dryer, to make Se powder dissolve. TOP Se was added to another solution of $Cd(Ac)_2$ heated to 140° C., and kept for 30 min. The precursor of Se was prepared.

Figure 16:
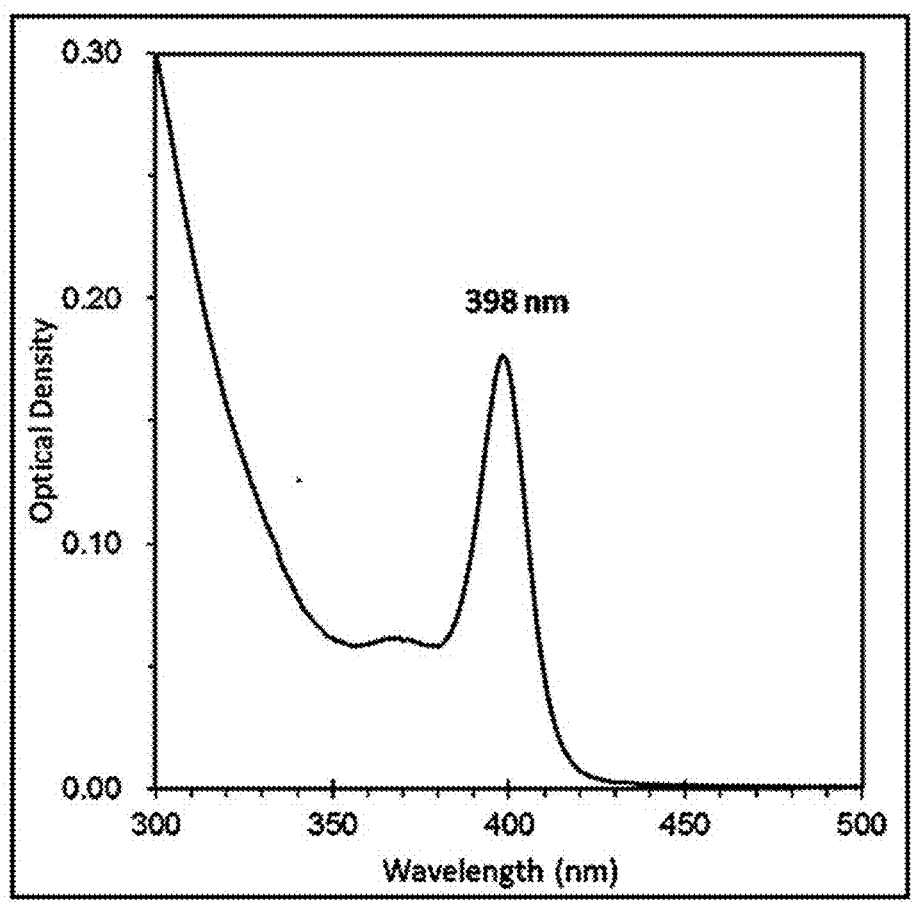
FIG. 16 is the detection spectra of magic-sized CdTeSe alloy nano-crystalline products in example 6.

2. Preparation of CdTeSe MSNCs
After the precursors of Te and Se were cooled, they were directly mixed and kept for 24 h at 25° C. 30 µL sample was dispersed in 3 mL toluene, that was measured with UV spectrophotometer, and the UV absorption peak of CdTeSe MSNCsF398 at 398 nm could be observed, as shown in FIG. 16.

Example 7

Figure 17:
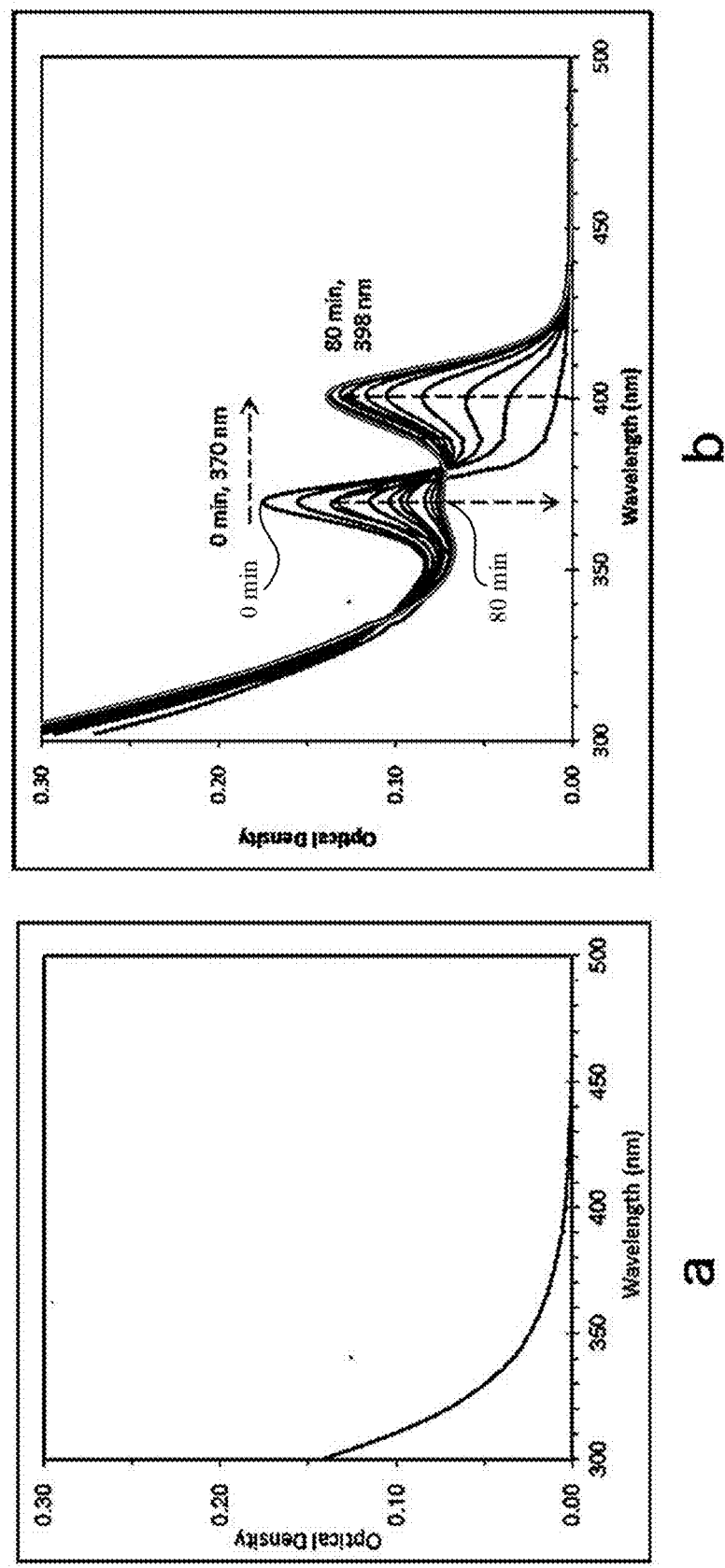
FIGS. 17a and 17b are the detection spectra of magic-sized CdTeSe nano-crystalline substances prepared using the method of example 7.
Figure 18:
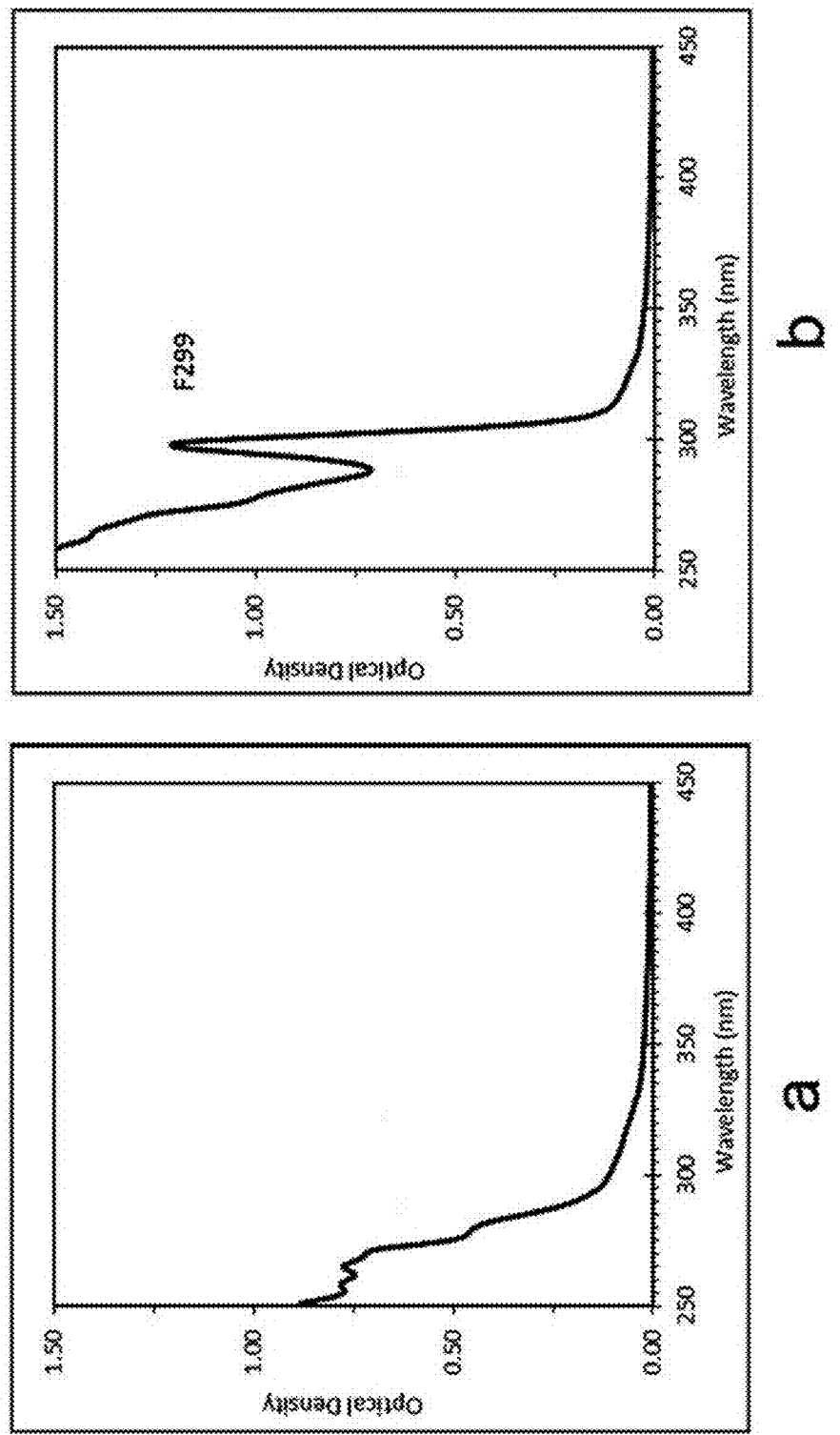
FIGS. 18a and 18b are the detection spectra of solvent effects during the preparation of magic-sized ZnSe nano-crystalline substances in example 9.

The precursors of Te and Se were prepared using the same way in example 6. After the precursors of Te and Se were cooled, they were directly mixed and kept for 24 h at 25° C. 30 μL sample was further taken and dispersed in 2.3 mL toluene, then kept for 20 h. No UV absorption peak can be found, indicating no intermediate for the crystal formation, as shown in FIG. 17a. 0.7 mL octylamine (OTA) was further added to the solution, and detection of UV absorption in situ was immediately carried out. The immediate formation of CdTe MSNCs F370 could be observed, and subsequently CdTe MSNCs F370 slowly vanished, while CdTeSe MSNCs F398 was slowly formed. After 80 min, pure CdTeSe MSNCs F398 was obtained, as shown in FIG. 17b.

Example 8 Preparation of Magic-Sized CdSeSnano-Crystalline Substances (CdSeS MSNCs)

Experimental Reactants:
cadmium oxide (CdO), powdered sulfur (S), powdered selenium (Se), trioctylphosphine (TOP), octadecene(ODE), oleic acid (OA), octylamine (OTA), all purchased from Aldrich;
toluene, methanol, ethanol, and isopropanol, available from Chengdu Kelong Chemical Reagent Factory.
Detection Apparatus:
Hitachi U-2910ultraviolet spectrophotometer.
I. Preparation
1. Preparation of CdSe precursor: 0.154 g CdO (1.20 mmol), 0.746 g OA (2.64 mmol), and 3.832 g ODE were placed in 50 mL three-necked reaction bottle, and at room temperature, suction gas and purging were carried out for 30 min, till no air bubble was produced. Under vacuum the reactants were heated to 120° C. and changed to $N_2$ atmosphere, then the reactants were continuously heated to 230° C. and kept for 1 hat 230° C., till the clear solution was obtained. The clear solution was cooled to 120° C. and evacuated for 30 min, then cooled to 60° C. 0.024 g Se powder (0.30 mmol) and 0.245 g TOP (1.32 mmol) were mixed and stirred at room temperature, till the solution was clear, and the solution of $Cd(OA)_2$ was injected at 60° C. and kept for 30 min. The sample was taken out.
Preparation of CdS precursor: 0.077 g CdO (0.60 mmol), 0.373 g (1.32 mmol) OA, and 4.423 g ODE were placed in 50 mL three-necked reaction bottle, and at room temperature, suction gas and purging were carried out for 30 min, till no air bubble was produced. Under vacuum the reactants were heated to 120° C. and changed to $N_2$ atmosphere, then the reactants were continuously heated to 230° C. and kept for 1 hat 230° C., till the clear solution was obtained. The clear solution was cooled to 120° C. and evacuated for 30 min, then cooled to 90° C. 0.005 g S powder (0.15 mmol) and 0.122 g TOP (0.33 mmol) were mixed and stirred at room temperature, till the solution was clear, and the solution of $Cd(OA)_2$ was injected at 90° C. and kept for 15 min. The sample was taken out.
2. Preparation of CdSeS MSCs: The prepared CdSe precursor and CdS precursor were mixed at room temperature in a v/v ratio of 600 μL:200 μL, 200 μL:200 μL, 200 μL:600 μL. The sample was taken out as the standing time, and 25 μL sample was dispersed in the mixed solution of 3 mL OTA/toluene. The growth was detected using in situ UV absorption spectrum.
The sample was dispersed in the mixed solvent of 1 mL OTA/2 mL TOL, the in situ UV absorption was immediately measured, and the measurement time was respectively (1) 0 min, (2) 15 min, (3) 45 min, (4) 2 h, (5) 5 h, (6) 10 h, (7) 23 h, (8) 50 h, and (9) 72 h. In the mixed sample, when CdSe was excess (a v/v ratio of 600 μL:200 μL), there was an absorption peak at 388 nm, and as the dispersion time, the absorption peak gradually became sharp, and the peak position was constant (as shown in FIG. 19a); For balanced mix (200 μL:200 μL), the absorption peak blue shifted to 379 nm (as shown in FIG. 19b); when CdS was excess (200 μL:600 μL), the absorption peak continuously blue shifted to 369 nm (as shown in FIG. 19c). Thus, it was indicated that addition of little amount of OTA could induce the formation of three members CdSeS MSCs, and by increasing the amount of CdSe in the mixture, the blue shift of absorption peak could be realized, proving the substance was alloy.

Example 9 Preparation of Magic-Sized ZnSenano-Crystalline Substances (ZnSe MSNCs)

Experimental Reactants:
Zincoxide (ZnO), powdered selenium (Se), trioctylphosphine (TOP), diphenylphosphine (DPP), oleic acid (OLA), octylamine (OTA), octadecene(ODE), all purchased from Aldrich;
Toluene, cyclohexane, methanol, ethanol, and isopropanol, available from Chengdu Kelong Chemical Reagent Factory.
Detection Apparatus:
Hitachi U-2910ultraviolet spectrophotometer.
I. Preparation
1. Preparation of Precursor
0.492 g ZnO, 3.739 g OA, and 5 g ODE were placed in three-necked bottle, and at room temperature, vacuum-nitrogen were exchanged for above three times and heated to 100° C., till no air bubble was produced, then the vacuum was changed to nitrogen atmosphere. The reactants were heated to 300° C. till the solid of zinc oxide was fully dissolved. The light yellow transparent solution formed, cooled to 110° C., and evacuated for 1 h before the solution was cooled to room temperature. The solution was transferred to glove box for storage.
0.428 g Se powder, 2.079 g TOP, and 0.827 g ODE were placed in three-necked bottle, and at room temperature, vacuum-nitrogen were exchanged for above three times. At room temperature, the reactants were stirred for 1 h under evacuating, and Se powder was fully dissolved (there was still small amount of residue).
2. Preparation of ZnSe Nano-Crystalline Substances
The precursor of Zn (2.2 mL) was dissolved in 3.726 mL ODE, and at room temperature, vacuum-nitrogen were exchanged for above three times. The reactants were heated to 100° C. and evacuated for 1 h, then cooled to 80° C. To 0.052 mL DPP, was added 0.215 mL TOPSe, then the mixture was added to the precursor of Zn. The heating program of 80° C./15 min, 100° C./15 min, 120° C./15 min, 140° C./15 min, 160° C./15 min, and 180° C./15 min was used. Finally, the sample of 180° C./15 min was taken out as the best experimental sample.
15 μL intermediate sample was taken out and dissolved in 3 mL cyclohexane for measuring the UV absorption, indicating no characteristic absorption peak of crystalline, as shown in FIG. 19a. But 15 μL intermediate sample was dispersed in the mixed solvent of 2 mL OTA and 1 mL cyclohexane, and ZnSe MSNCsF299 immediately formed, as shown in FIG. 19b. It was indicated that the mixed solvent of OTA and cyclohexane could induce the intermediate to produce ZnSe MSNCs F299.

The invention claimed is:

1. A method for preparing a magic-sized nano-crystalline substance, comprising:
    preparing a reaction mixture comprising a metal element selected from organic acid salts or inorganic acid salts of Cd, Pb, Zn, In, and Ga and a non-metal element selected from S, Se, Te, P, and As, wherein a molar ratio of said metal element and said non-metal element is (4-8):1;
    heating the reaction mixture to a reaction temperature of 120° C. to 240° C.;
    maintaining the reaction temperature for 5 min to 30 min:
    adding an additive to the reaction mixture, wherein the additive is selected from acetone, ethyl acetate, acetic acid, methanol, ethanol, chloroform, tetrahydrofuran, water, and ethylamine;
    cooling the reaction mixture to a temperature that is 50% or lower than the reaction temperature; and
    obtaining the magic-sized nano-crystalline substance after standing.

2. The method according to claim 1, wherein the reaction mixture comprises an organic solvent selected from octadecene, trioctylphosphine, oleic acid, oleyl amine, and mixtures thereof.

3. The method according to claim 2, the organic solvent is a mixture of oleic acid and octadecene in which a volume percentage of octadecene is less than or equal to 30%.

4. The method according to claim 2, the organic solvent is a mixture of oleyl amine and octadecene mixed in which the volume percentage of octadeceneis is less than or equal to 30%.

5. The method according to claim 1, wherein a half peak width of peaks in UV absorption spectrum for the magic-sized nano-crystalline substance is 10-20 nm.

6. The method according to claim 1, wherein a molar ratio of Cd and Te in the reaction mixture is larger than or equal to 4:1, the reaction temperature is 120° C.-160° C., and after completion of reaction, the temperature for cooling and standing ranges from room temperature to the liquid nitrogen temperature, and the magic-sized nano-crystalline substance is CdTe.

7. The preparative method according to claim 1, further comprising cooling and the reaction mixture to a temperature ranging from −18° C. to the liquid nitrogen temperature, and then increasing the temperature of the reaction mixture to −18° C. to 30° C. for standing.

8. The method according to claim 1, wherein a molar ratio of Cd and S in the reaction mixture is larger than or equal to 4:1, a ratio of oleic acid and cadmium equals 2.2:1, the reaction temperature is 120° C. to 240° C., and the temperature for cooling and standing is −20° C. to 80° C., and the magic-sized nano-crystalline substance is CdS.

9. The method according to claim 1, wherein a molar ratio of Cd and Se in the reaction mixture is larger than or equal to 4:1, the reaction temperature is 120° C. to 160° C., and the temperature for cooling and standing is from liquid nitrogen temperature to 60° C.

10. The method of claim 1 wherein the additive is selected from the group consisting of methanol, ethanol, tetrahydrofuran and ethylamine.

11. A method for preparing a magic-sized nano-crystalline substance, comprising:
    preparing a reaction mixture comprising a metal element selected from organic acid salts or inorganic acid salts of Cd, Pb, Zn, In, and Ga and a non-metal element selected from S, Se, Te, P, and As, wherein a molar ratio of said metal element and said non-metal element is (4-8):1;
    heating the reaction mixture to a reaction temperature of 120° C. to 240° C.;
    maintaining the reaction temperature for 5 min to 30 min;
    adding a diluent and an additive into the reaction mixture;
    cooling the resulting reaction mixture to a temperature that is 50% or lower than the reaction temperature; and
    obtaining the magic-sized nano-crystalline substance after standing, wherein the diluent is toluene or cyclohexane, and the additive is selected from butylamine, octylamine, dodecylamine, oleyl amine, methanol, ethanol, isopropanol, hexanol, decanol, tetrahydrofuran, and carboxylic acids, and
    wherein a volume ratio of additive and the diluent is 1:(60-150).

* * * * *